(12) United States Patent
Yamazaki et al.

(10) Patent No.: US 8,334,540 B2
(45) Date of Patent: Dec. 18, 2012

(54) DISPLAY DEVICE

(75) Inventors: Shunpei Yamazaki, Setagaya (JP); Kengo Akimoto, Atsugi (JP); Shigeki Komori, Isehara (JP); Hideki Uochi, Atsugi (JP); Tomoya Futamura, Atsugi (JP); Takahiro Kasahara, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/173,559

(22) Filed: Jun. 30, 2011

(65) Prior Publication Data

US 2011/0260159 A1 Oct. 27, 2011

Related U.S. Application Data

(63) Continuation of application No. 12/571,552, filed on Oct. 1, 2009, now Pat. No. 7,989,815.

(30) Foreign Application Priority Data

Oct. 3, 2008 (JP) .................................. 2008-259063

(51) Int. Cl.
*H01L 29/04* (2006.01)
(52) U.S. Cl. ... 257/72; 257/350; 257/532; 257/E33.004; 257/E33.062; 438/30; 438/152; 438/155; 438/255
(58) Field of Classification Search .................... 257/72, 257/350, 532, E33.004, 43, 59, 98, 309, E33.062, 257/E29.343, E21.012, E29.296, E33.019; 438/255, 30, 152, 155, 398
See application file for complete search history.

(56) References Cited

U.S. PATENT DOCUMENTS

| | | | |
|---|---|---|---|
| 3,819,952 A | 6/1974 | Enomoto et al. |
| 5,233,448 A | 8/1993 | Wu |
| 5,464,990 A | 11/1995 | Shiratsuki et al. |
| 5,585,949 A | 12/1996 | Yamazaki et al. |
| 5,691,787 A | 11/1997 | Shimada et al. |
| 5,731,856 A | 3/1998 | Kim et al. |

(Continued)

FOREIGN PATENT DOCUMENTS

EP 1 737 044 A 12/2006

(Continued)

OTHER PUBLICATIONS

International Search Report (Application No. PCT/JP2009/067118) dated Oct. 27, 2009.

(Continued)

*Primary Examiner* — N Drew Richards
*Assistant Examiner* — Ankush Singal
(74) *Attorney, Agent, or Firm* — Eric J. Robinson; Robinson Intellectual Property Law Office, P.C.

(57) ABSTRACT

The protective circuit is formed using a non-linear element which includes a gate insulating film covering a gate electrode; a first wiring layer and a second wiring layer which are over the gate insulating film and whose end portions overlap with the gate electrode; and an oxide semiconductor layer which is over the gate electrode and in contact with the gate insulating film and the end portions of the first wiring layer and the second wiring layer. The gate electrode of the non-linear element and a scan line or a signal line is included in a wiring, the first or second wiring layer of the non-linear element is directly connected to the wiring so as to apply the potential of the gate electrode.

24 Claims, 26 Drawing Sheets

U.S. PATENT DOCUMENTS

| | | | |
|---|---|---|---|
| 5,744,864 A | 4/1998 | Cillessen et al. | |
| 5,804,861 A | 9/1998 | Leach | |
| 5,847,410 A | 12/1998 | Nakajima | |
| 6,294,274 B1 | 9/2001 | Kawazoe et al. | |
| 6,411,348 B2 | 6/2002 | Kawai et al. | |
| 6,563,174 B2 | 5/2003 | Kawasaki et al. | |
| 6,586,346 B1 | 7/2003 | Yamazaki et al. | |
| 6,680,242 B2 | 1/2004 | Ohtsu et al. | |
| 6,696,701 B2 | 2/2004 | Hector et al. | |
| 6,727,522 B1 | 4/2004 | Kawasaki et al. | |
| 6,740,596 B2 | 5/2004 | Hayase et al. | |
| 6,762,802 B2 | 7/2004 | Ono et al. | |
| 6,914,643 B1 * | 7/2005 | Nagase et al. | 349/40 |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,067,843 B2 | 6/2006 | Carcia et al. | |
| 7,105,868 B2 | 9/2006 | Nause et al. | |
| 7,145,174 B2 | 12/2006 | Chiang et al. | |
| 7,211,825 B2 | 5/2007 | Shih et al | |
| 7,259,429 B2 | 8/2007 | Yamazaki | |
| 7,262,463 B2 | 8/2007 | Hoffman | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,301,211 B2 * | 11/2007 | Yamazaki et al. | 257/410 |
| 7,304,351 B2 | 12/2007 | Liu et al. | |
| 7,323,356 B2 | 1/2008 | Hosono et al. | |
| 7,339,187 B2 | 3/2008 | Wager et al. | |
| 7,342,617 B2 * | 3/2008 | Tanaka et al. | 349/40 |
| 7,379,039 B2 | 5/2008 | Yumoto | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,453,420 B2 | 11/2008 | Watanabe et al. | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,501,293 B2 | 3/2009 | Ito et al. | |
| 7,507,618 B2 | 3/2009 | Dunbar | |
| 7,544,967 B2 | 6/2009 | Kim et al. | |
| 7,566,904 B2 | 7/2009 | Ishii | |
| 7,575,966 B2 | 8/2009 | Lai et al. | |
| 7,576,394 B2 | 8/2009 | Furuta et al. | |
| 7,601,984 B2 | 10/2009 | Sano et al. | |
| 7,608,531 B2 | 10/2009 | Isa et al. | |
| 7,622,371 B2 | 11/2009 | Pan et al. | |
| 7,635,889 B2 | 12/2009 | Isa et al. | |
| 7,645,478 B2 | 1/2010 | Thelss et al. | |
| 7,663,302 B2 | 2/2010 | Shin et al. | |
| 7,674,650 B2 | 3/2010 | Akimoto et al. | |
| 7,687,808 B2 | 3/2010 | Umezaki | |
| 7,691,666 B2 | 4/2010 | Levy et al. | |
| 7,732,251 B2 | 6/2010 | Hoffman et al. | |
| 7,732,819 B2 | 6/2010 | Akimoto et al. | |
| 7,733,015 B2 | 6/2010 | Saito | |
| 7,764,264 B2 | 7/2010 | Nakao et al. | |
| 7,767,106 B2 | 8/2010 | Chang | |
| 7,768,585 B2 * | 8/2010 | Nakamura | 349/40 |
| 7,772,021 B2 | 8/2010 | Lee et al. | |
| 7,781,772 B2 * | 8/2010 | Yamazaki et al. | 257/66 |
| 7,791,072 B2 | 9/2010 | Kumomi et al. | |
| 7,791,082 B2 | 9/2010 | Iwasaki | |
| 7,795,613 B2 | 9/2010 | Ito et al. | |
| 7,795,618 B2 | 9/2010 | Yamazaki et al. | |
| 7,804,091 B2 | 9/2010 | Takechi et al. | |
| 7,829,444 B2 | 11/2010 | Yabuta et al. | |
| 7,863,611 B2 | 1/2011 | Abe et al. | |
| 7,867,636 B2 | 1/2011 | Nakagawara et al. | |
| 7,868,326 B2 | 1/2011 | Sano et al. | |
| 7,868,338 B2 | 1/2011 | Kim et al. | |
| 7,872,259 B2 | 1/2011 | Den et al. | |
| 7,884,360 B2 | 2/2011 | Takechi et al. | |
| 7,923,722 B2 | 4/2011 | Ryu et al. | |
| 7,932,521 B2 | 4/2011 | Akimoto et al. | |
| 7,935,641 B2 | 5/2011 | Kim et al. | |
| 7,939,822 B2 | 5/2011 | Maekawa et al. | |
| 7,982,215 B2 | 7/2011 | Inoue et al. | |
| 7,989,815 B2 | 8/2011 | Yamazaki et al. | |
| 2001/0045996 A1 | 11/2001 | Kawai et al. | |
| 2001/0046027 A1 | 11/2001 | Tai et al. | |
| 2002/0009890 A1 | 1/2002 | Hayase et al. | |
| 2002/0056838 A1 | 5/2002 | Ogawa | |
| 2003/0030054 A1 | 2/2003 | Hector et al. | |
| 2003/0189401 A1 | 10/2003 | Kido et al. | |
| 2003/0207506 A1 * | 11/2003 | Satou | 438/158 |
| 2004/0027502 A1 * | 2/2004 | Tanaka et al. | 349/40 |
| 2004/0027525 A1 * | 2/2004 | Itakura et al. | 349/141 |
| 2004/0048405 A1 * | 3/2004 | Hirota | 438/29 |
| 2004/0207615 A1 | 10/2004 | Yumoto | |
| 2005/0082541 A1 * | 4/2005 | Satou | 257/72 |
| 2005/0157236 A1 | 7/2005 | Kawasaki | |
| 2005/0233509 A1 * | 10/2005 | Satou | 438/158 |
| 2005/0275038 A1 | 12/2005 | Shih et al. | |
| 2005/0285198 A1 | 12/2005 | Chang et al. | |
| 2006/0086933 A1 | 4/2006 | Iechi et al. | |
| 2006/0145951 A1 | 7/2006 | Watanabe et al. | |
| 2006/0170111 A1 * | 8/2006 | Isa et al. | 257/775 |
| 2006/0197092 A1 | 9/2006 | Hoffman et al. | |
| 2006/0208977 A1 | 9/2006 | Kimura | |
| 2006/0220581 A1 | 10/2006 | Yamazaki et al. | |
| 2006/0238135 A1 | 10/2006 | Kimura | |
| 2006/0244107 A1 | 11/2006 | Sugihara et al. | |
| 2006/0244699 A1 | 11/2006 | Yamazaki | |
| 2006/0261338 A1 * | 11/2006 | Yamazaki et al. | 257/59 |
| 2006/0286737 A1 | 12/2006 | Levy et al. | |
| 2007/0004202 A1 | 1/2007 | Fujii | |
| 2007/0026580 A1 | 2/2007 | Fujii | |
| 2007/0030434 A1 * | 2/2007 | Hirabayashi et al. | 349/149 |
| 2007/0052025 A1 | 3/2007 | Yabuta | |
| 2007/0090365 A1 | 4/2007 | Hayashi et al. | |
| 2007/0108446 A1 * | 5/2007 | Akimoto | 257/61 |
| 2007/0115245 A1 | 5/2007 | Nakao et al. | |
| 2007/0152217 A1 | 7/2007 | Lai et al. | |
| 2007/0161184 A1 | 7/2007 | Kim et al. | |
| 2007/0172591 A1 | 7/2007 | Seo et al. | |
| 2007/0187678 A1 | 8/2007 | Hirao et al. | |
| 2007/0194379 A1 | 8/2007 | Hosono et al. | |
| 2007/0205976 A1 | 9/2007 | Takatori et al. | |
| 2007/0252928 A1 | 11/2007 | Ito et al. | |
| 2007/0272922 A1 * | 11/2007 | Kim et al. | 257/43 |
| 2007/0287296 A1 | 12/2007 | Chang | |
| 2007/0295973 A1 * | 12/2007 | Jinbo et al. | 257/88 |
| 2008/0001091 A1 * | 1/2008 | Kobayashi et al. | 250/366 |
| 2008/0006877 A1 * | 1/2008 | Mardilovich et al. | 257/347 |
| 2008/0024091 A1 | 1/2008 | Yamazaki et al. | |
| 2008/0035920 A1 | 2/2008 | Takechi et al. | |
| 2008/0073653 A1 * | 3/2008 | Iwasaki | 257/79 |
| 2008/0079685 A1 | 4/2008 | Umezaki et al. | |
| 2008/0106191 A1 | 5/2008 | Kawase | |
| 2008/0129195 A1 | 6/2008 | Ishizaki et al. | |
| 2008/0143531 A1 | 6/2008 | Tadokoro | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0237598 A1 | 10/2008 | Nakayama | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0002287 A1 * | 1/2009 | Kitazawa | 345/82 |
| 2009/0008639 A1 | 1/2009 | Akimoto et al. | |
| 2009/0033818 A1 | 2/2009 | Nakajima et al. | |
| 2009/0065771 A1 | 3/2009 | Iwasaki et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0141202 A1 | 6/2009 | Yoshida | |
| 2009/0152506 A1 | 6/2009 | Umeda et al. | |
| 2009/0179572 A1 | 7/2009 | Fukumoto et al. | |
| 2009/0186437 A1 | 7/2009 | Akimoto | |
| 2009/0186445 A1 | 7/2009 | Akimoto | |

| | | | |
|---|---|---|---|
| 2009/0189155 | A1 | 7/2009 | Akimoto |
| 2009/0189156 | A1 | 7/2009 | Akimoto |
| 2009/0224245 | A1* | 9/2009 | Umezaki .................. 257/59 |
| 2009/0278122 | A1 | 11/2009 | Hosono et al. |
| 2009/0280600 | A1 | 11/2009 | Hosono et al. |
| 2010/0025678 | A1 | 2/2010 | Yamazaki et al. |
| 2010/0065839 | A1 | 3/2010 | Yamazaki et al. |
| 2010/0065840 | A1 | 3/2010 | Yamazaki et al. |
| 2010/0065844 | A1 | 3/2010 | Tokunaga |
| 2010/0072470 | A1 | 3/2010 | Yamazaki et al. |
| 2010/0072471 | A1 | 3/2010 | Yamazaki et al. |
| 2010/0084653 | A1 | 4/2010 | Yamazaki et al. |
| 2010/0084654 | A1 | 4/2010 | Yamazaki et al. |
| 2010/0092800 | A1 | 4/2010 | Itagaki et al. |
| 2010/0109002 | A1 | 5/2010 | Itagaki et al. |
| 2010/0163876 | A1 | 7/2010 | Inoue et al. |

FOREIGN PATENT DOCUMENTS

| | | | |
|---|---|---|---|
| EP | 2 226 847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 03-231472 | A | 10/1991 |
| JP | 05-251705 | A | 9/1993 |
| JP | 08-179262 | A | 7/1996 |
| JP | 08-179358 | A | 7/1996 |
| JP | 08-179359 | A | 7/1996 |
| JP | 08-254693 | A | 10/1996 |
| JP | 08-264794 | A | 10/1996 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-069028 | A | 3/2003 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-245093 | A | 9/2006 |
| JP | 2007-096055 | | 4/2007 |
| JP | 2007-123861 | | 5/2007 |
| JP | 2007-150158 | A | 6/2007 |
| JP | 2007-250983 | A | 9/2007 |
| WO | WO 2004/114391 | | 12/2004 |
| WO | WO 2006/138071 | | 12/2006 |
| WO | WO 2007/119386 | | 10/2007 |

OTHER PUBLICATIONS

Written Opinion (Application No. PCT/JP2009/067118) dated Oct. 27, 2009.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds In$MO_3$(ZnO)$_m$ (M=In,Ga; m=Integer) Described by Four-Dimensional Superspace Group," Journal of Solid State Chemistry, 1998, vol. 139, pp. 347-355.

Lee et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: AL and SN-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5') Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display With Driver Circuit Using Amorphous In-Ga-Zn-Oxide TFTS," IDW '09: Proceedings of the 16$^{th}$ International Display Workshops, 2009, pp. 689-692.

Park et al., "Amorphous Indium-Gallium-Zinc Oxide TFTS and Their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel Using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined with Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Park et al., "High performance amorphous oxide thin film transistors with self-aligned top-gate structure," IEDM 09: Technical Digest of International Electron Devices Meeting, Dec. 7, 2009, pp. 191-194.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review. B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), 2007, vol. 76, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review. B), 2008, vol. 77, pp. 245202-1-245202-6.

Orita et al., "Amorphous transparent conductive oxide $InGaO_3(ZnO)_m$ (m <4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

* cited by examiner

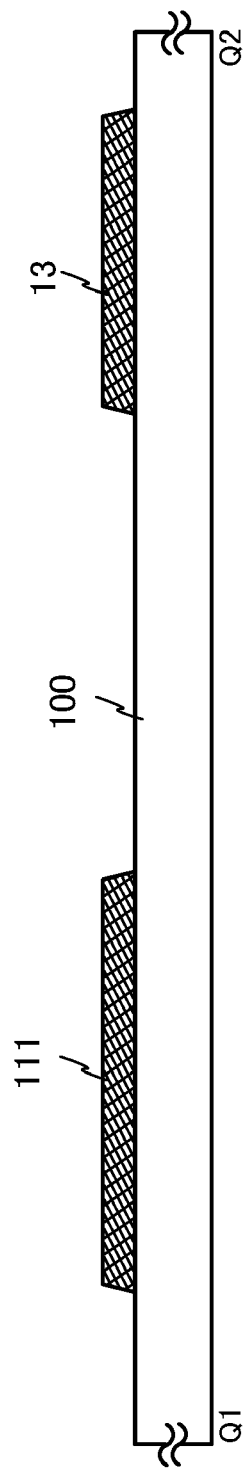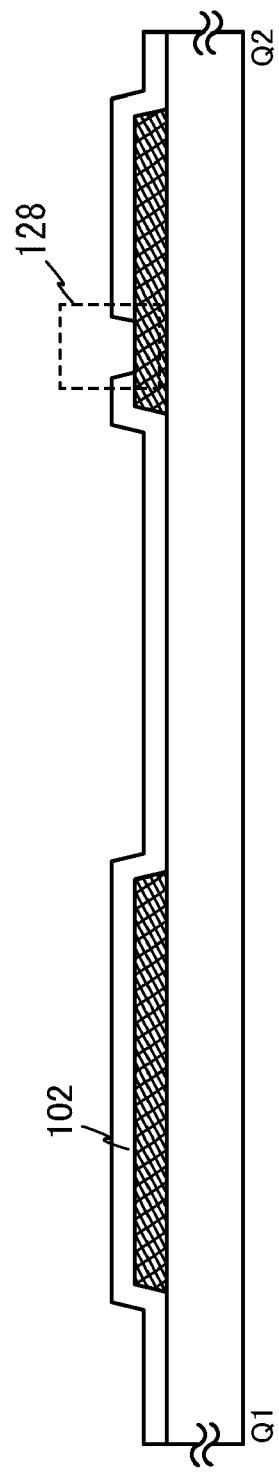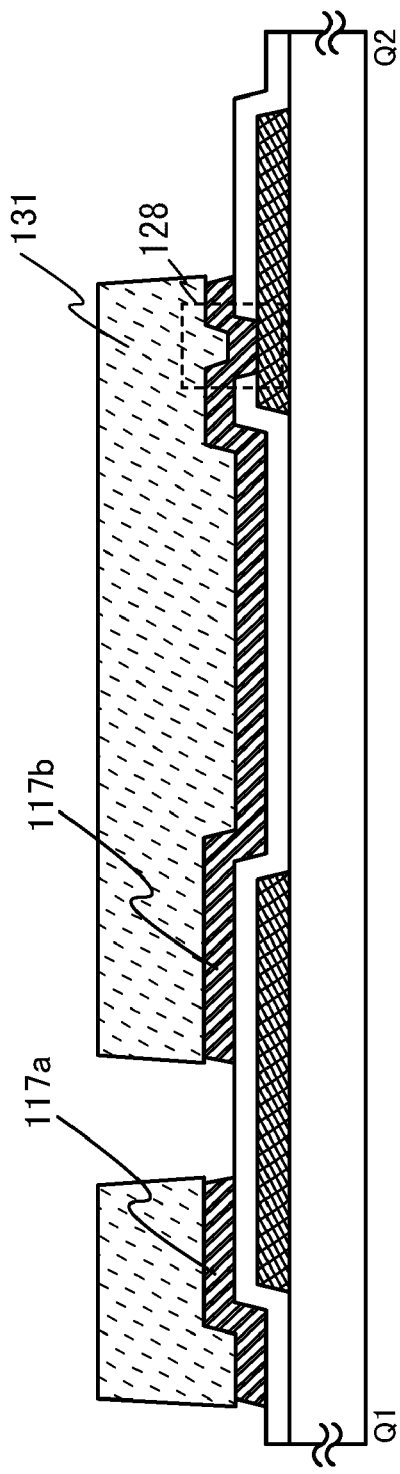

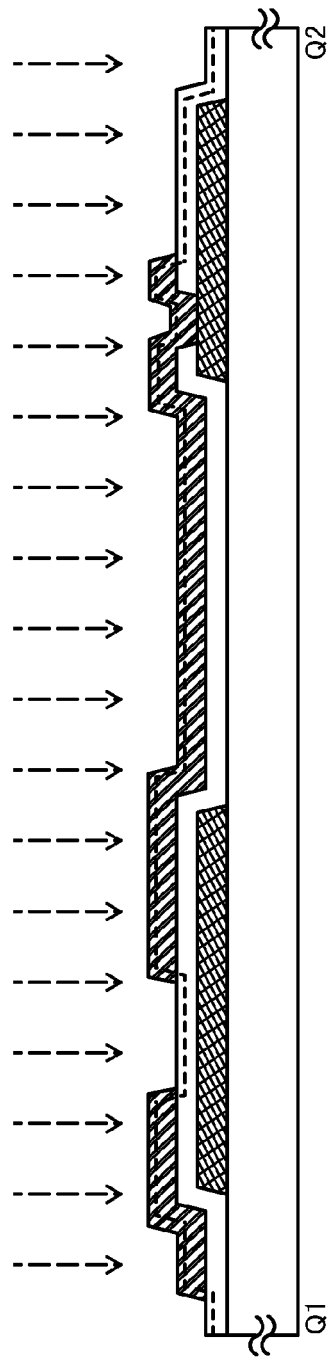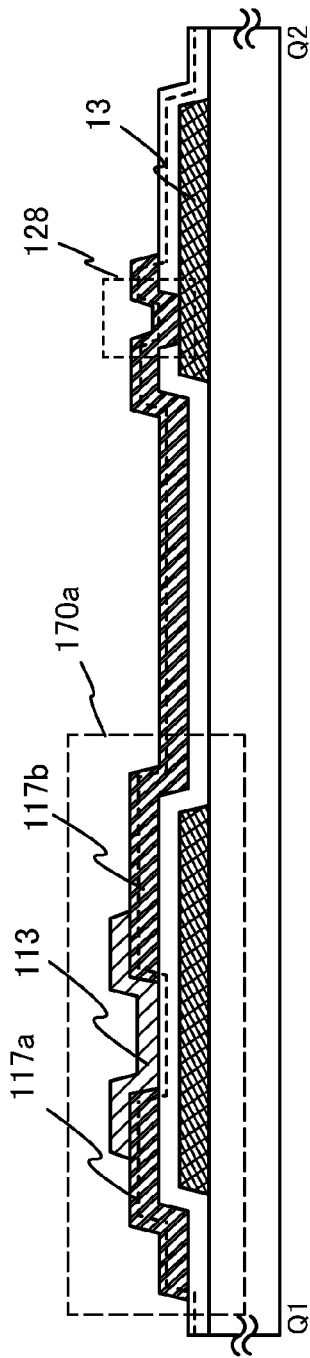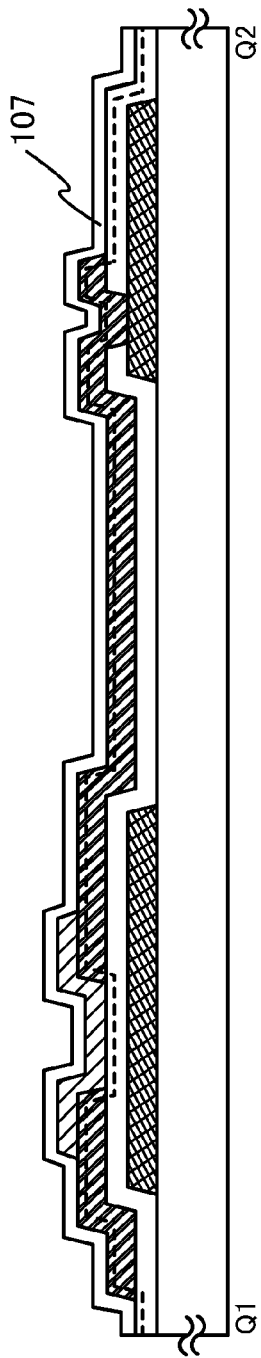

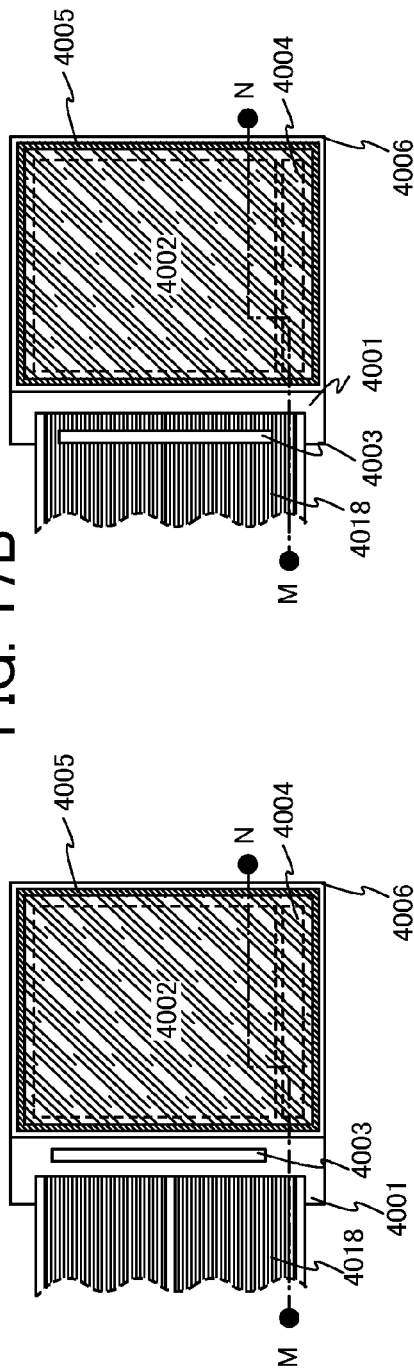
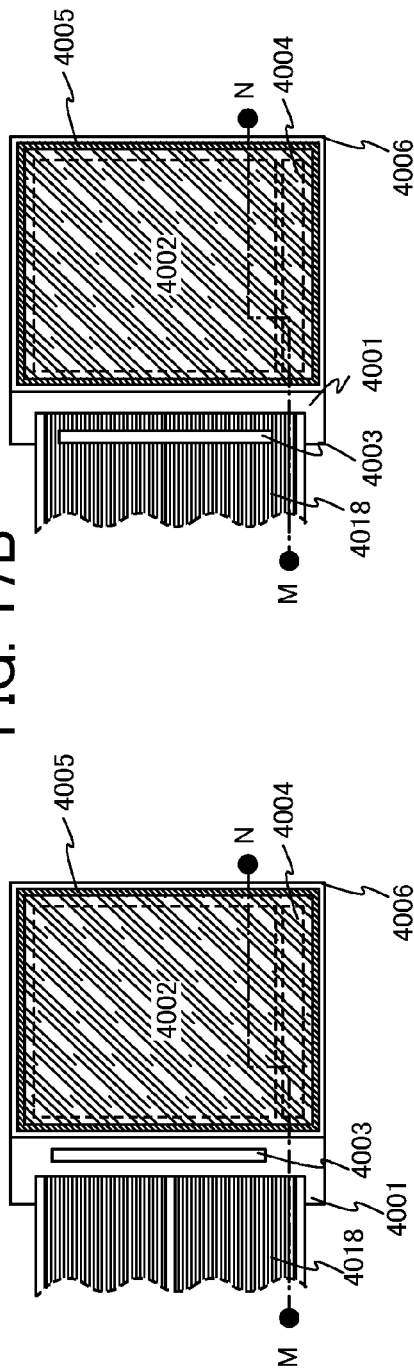
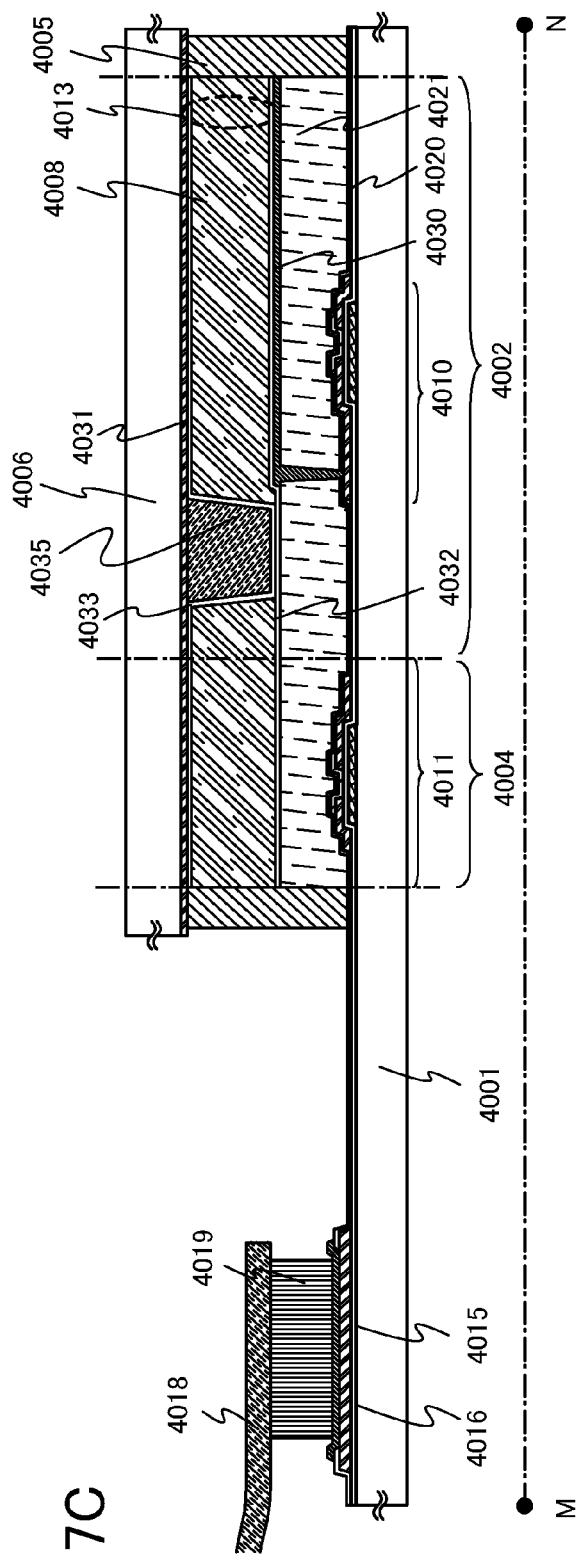

DISPLAY DEVICE

TECHNICAL FIELD

The present invention relates to a display device including an oxide semiconductor.

BACKGROUND ART

A thin film transistor formed over a flat plate such as a glass substrate is manufactured using amorphous silicon or polycrystalline silicon, as typically seen in a liquid crystal display device. Thin film transistors manufactured using amorphous silicon have low field effect mobility, but can be formed over a glass substrate with a larger area. On the other hand, thin film transistors manufactured using polycrystalline silicon have high field effect mobility, but a crystallization step such as laser annealing is necessary and are not always suitable for a larger glass substrate.

In view of the foregoing, attention has been drawn to a technique for manufacturing a thin film transistor using an oxide semiconductor, and applying the transistor to an electronic device or an optical device. For example, Patent Document 1 and Patent Document 2 disclose a technique by which a thin film transistor is manufactured using an oxide semiconductor containing zinc oxide (ZnO) or containing indium, gallium, and zinc as an oxide semiconductor film and such a transistor is used as a switching element or the like of an image display device.

REFERENCE

[Patent Document 1] Japanese Published Patent Application No. 2007-123861
[Patent Document 2] Japanese Published Patent Application No. 2007-96055

DISCLOSURE OF INVENTION

A thin film transistor in which a channel formation region is formed using an oxide semiconductor has properties as follows: the operation speed is higher than that of a thin film transistor including amorphous silicon and the manufacturing process is simpler than that of a thin film transistor including polycrystalline silicon. That is, the use of an oxide semiconductor makes it possible to manufacture a thin film transistor with high field effect mobility even at low process temperatures ranging from room temperature to 300° C. or lower.

In order to take advantage of the properties and to ensure the reliability of a display device including an oxide semiconductor, which is superior in operating characteristics and can be manufactured at low temperatures, it is necessary that a protective circuit and the like having appropriate structures are formed in the display device. Moreover, it is necessary to reduce an area occupied by the protective circuit for achieving reduction in size of the display device.

An object of the present invention is to provide a structure which is suitable for a protective circuit.

Another object of the present invention is to enhance the function of a protective circuit and stabilize the operation in a display device intended for a variety of purposes manufactured by stacking an insulating film and a conductive film in addition to an oxide semiconductor.

An embodiment of the present invention is a display device in which a protective circuit is formed using a non-linear element including an oxide semiconductor. Further, at least one of a first wiring layer and a second wiring layer included in the non-linear element which is used for forming the protective circuit is directly connected to a gate electrode or a conductive film formed in the same step as a gate electrode.

An illustrative embodiment of the present invention is a display device which includes scan lines and signal lines provided over a substrate having an insulating surface so as to intersect with each other, a pixel portion in which pixel electrodes are arranged in matrix, and a non-linear element formed using an oxide semiconductor in a region outside the pixel portion. The pixel portion includes a thin film transistor in which a channel formation region is formed in an oxide semiconductor layer. The thin film transistor in the pixel portion includes a gate electrode which is connected to the scan line, a first wiring layer which is connected to the signal line and which is in contact with the oxide semiconductor layer, and a second wiring layer which is connected to the pixel electrode and which is in contact with the oxide semiconductor layer. Moreover, the non-linear element is provided between the pixel portion and a signal input terminal disposed at the periphery of the substrate. The non-linear element includes a gate electrode; a gate insulating film covering the gate electrode; a third wiring layer and a fourth wiring layer each of which is over the gate insulating film and formed from a conductive layer and whose end portions overlap with the gate electrode; and an oxide semiconductor layer which overlaps with at least the gate electrode and which is in contact with the gate insulating film, and the end portions of the third wiring layer and the fourth wiring layer. The gate electrode of the non-linear element is connected to the scan line or the signal line, and the third wiring layer or the fourth wiring layer of the non-linear element is directly connected to the gate electrode so as to apply the potential of the gate electrode to the first wiring layer or the second wiring layer.

An illustrative embodiment of the present invention is a display device which includes scan lines and signal lines provided over a substrate having an insulating surface so as to intersect with each other, a pixel portion in which pixel electrodes are arranged in matrix, and a protective circuit in a region outside the pixel portion. The pixel portion includes a thin film transistor in which a channel formation region is formed in an oxide semiconductor layer. The thin film transistor in the pixel portion includes a gate electrode which is connected to the scan line, a first wiring layer which is connected to the signal line and which is in contact with the oxide semiconductor layer, and a second wiring layer which is connected to the pixel electrode and which is in contact with the oxide semiconductor layer. In the region outside the pixel portion, a protective circuit for connecting the scan line and a common wiring to each other and a protective circuit for connecting the signal line and a common wiring to each other are provided. The protective circuit includes a non-linear element, which includes a gate electrode; a gate insulating film covering the gate electrode; a third wiring layer and a fourth wiring layer each of which is over the gate insulating film and formed from a conductive layer and whose end portions overlap with the gate electrode; and an oxide semiconductor layer which overlaps with at least the gate electrode and which is in contact with the gate insulating film, and the end portions of the first wiring layer and the second wiring layer. The gate electrode of the non-linear element included in the protective circuit is directly connected to the first wiring layer or the second wiring layer.

Note that the ordinal numbers such as "first" and "second" in this specification are used for convenience and do not denote the order of steps and the stacking order of layers. In addition, the ordinal numbers in this specification do not denote particular names which specify the invention.

According to an embodiment of the present invention, a protective circuit is formed using a non-linear element including an oxide semiconductor, whereby a display device having a structure suitable for a protective circuit can be obtained.

In addition, there is a method in which the first or second wiring layer and the gate electrode or the wiring formed with the same layer as the gate electrode are connected using another wiring layer by providing a contact hole reaching the first or second wiring layer and a contact hole reaching the gate electrode or the wiring formed with the same layer as the gate electrode. However, two interfaces and two contact holes are formed for one connection in this method.

In the non-linear element included in the protective circuit according to an embodiment of the present invention, the conductive layer of the first or second wiring layer is directly connected to the gate electrode or the wiring formed with the same layer as the gate electrode; thus, only one interface and one contact hole are formed for one connection. The connection method of the present invention enables contact resistance to be reduced as compared with the connection method using another wiring layer because the number of interfaces formed for one connection is only one. Accordingly, the protective circuit including the non-linear element operates stably. In addition, the connection method of the present invention enables an area occupied by the connection portion to be reduced as compared with the connection method using another wiring because only one contact hole is needed for one connection. Accordingly, an area occupied by the protective circuit can be reduced and reduction in size of the display device can be achieved.

BRIEF DESCRIPTION OF DRAWINGS

FIGS. 6A to 6C are cross-sectional views illustrating a process for manufacturing a protective circuit.

FIGS. 7A to 7C are cross-sectional views illustrating a process for manufacturing a protective circuit.

FIGS. 17A and B are top views and FIG. 17C is a cross-sectional view, each illustrating a semiconductor device of an embodiment of the present invention.

BEST MODE FOR CARRYING OUT THE INVENTION

Figure 1:
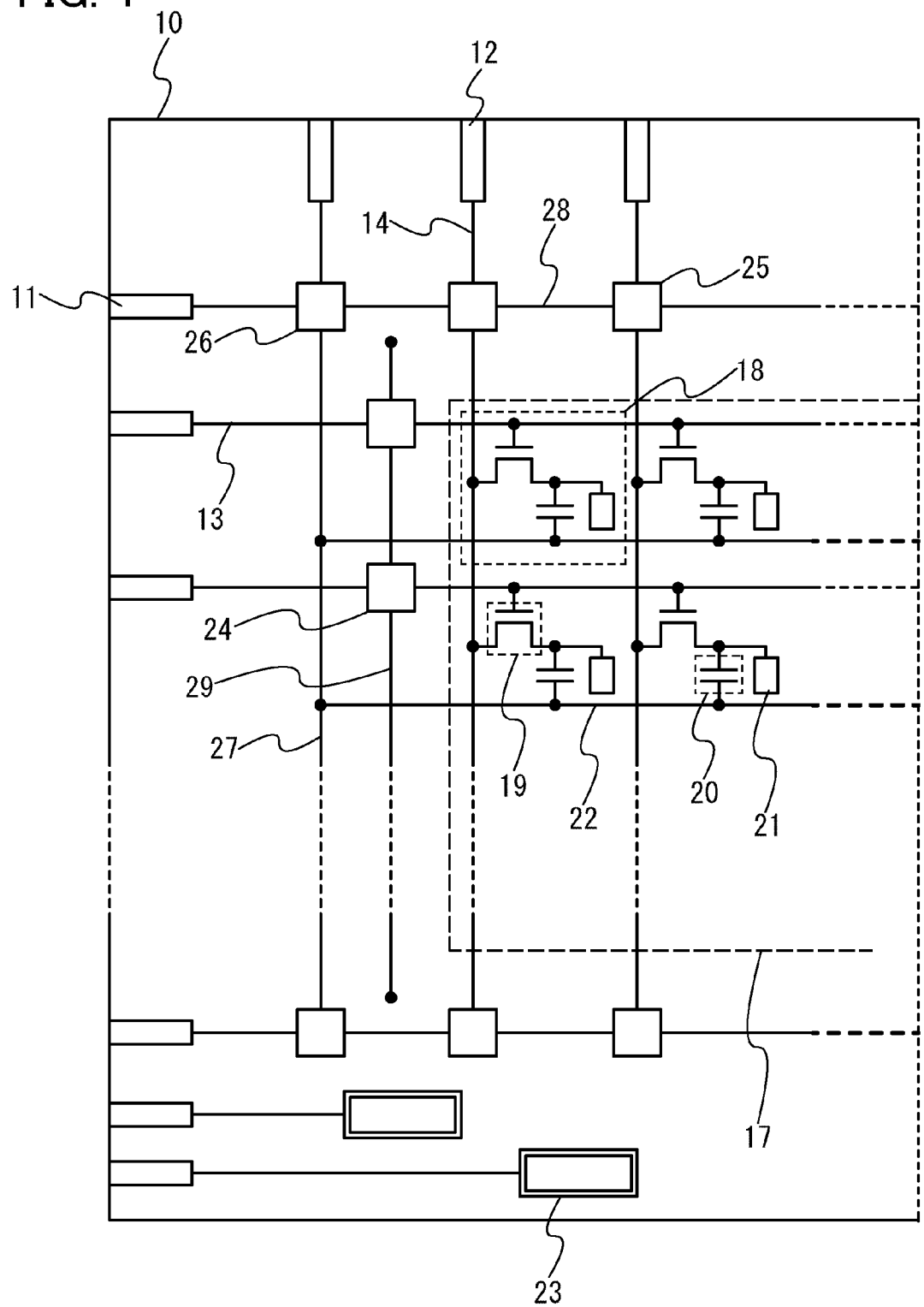
FIG. 1 illustrates a positional relationship among signal input terminals, scan lines, signal lines, protective circuits including non-linear elements, and a pixel portion in a display device.

Hereinafter, embodiments of the present invention are described below with reference to the drawings. The present invention is not limited to the description below and it is easily understood by those skilled in the art that the mode and details can be changed variously without departing from the scope and spirit of the present invention. Therefore, the present invention should not be interpreted as being limited to what is described in the embodiments described below. Note that a reference numeral denoting the same portion in different figures is used in common in the structures of the present invention which is explained below.

Embodiment 1

In this embodiment, an example of a display device including a pixel portion and a protective circuit which includes a non-linear element provided near the pixel portion is described with reference to drawings.

FIG. 1 illustrates a positional relationship among signal input terminals, scan lines, signal lines, protective circuits including non-linear elements, and a pixel portion in a display device. Over a substrate 10 having an insulating surface, scan lines 13 and signal lines 14 intersect with each other to form a pixel portion 17.

The pixel portion 17 includes a plurality of pixels 18 arranged in matrix. The pixel 18 includes a pixel transistor 19 connected to the scan line 13 and the signal line 14, a storage capacitor portion 20, and a pixel electrode 21.

In the pixel structure illustrated here, one electrode of the storage capacitor portion 20 is connected to the pixel transistor 19 and the other electrode is connected to a capacitor line 22. Moreover, the pixel electrode 21 forms one electrode which drives a display element (such as a liquid crystal element, a light-emitting element, or a contrast medium (electronic ink)). The other electrode of such a display element is connected to a common terminal 23.

The protective circuit is provided between the pixel portion 17, and a scan line input terminal 11 and a signal line input terminal 12. In FIG. 1, a plurality of protective circuits are provided in a display device. Therefore, even though surge voltage due to static electricity and the like is applied to the scan line 13, the signal line 14, and a capacitor bus line 27, the pixel transistor 19 and the like are not broken. Accordingly, the protective circuit has a structure for releasing charge to a common wiring 29 or a common wiring 28 when surge voltage is applied to the protective circuit.

In FIG. 1, a protective circuit 24, a protective circuit 25, and a protective circuit 26 are provided in the display device. Needless to say, the structures of the protective circuits are not limited to those above.

Figure 2:
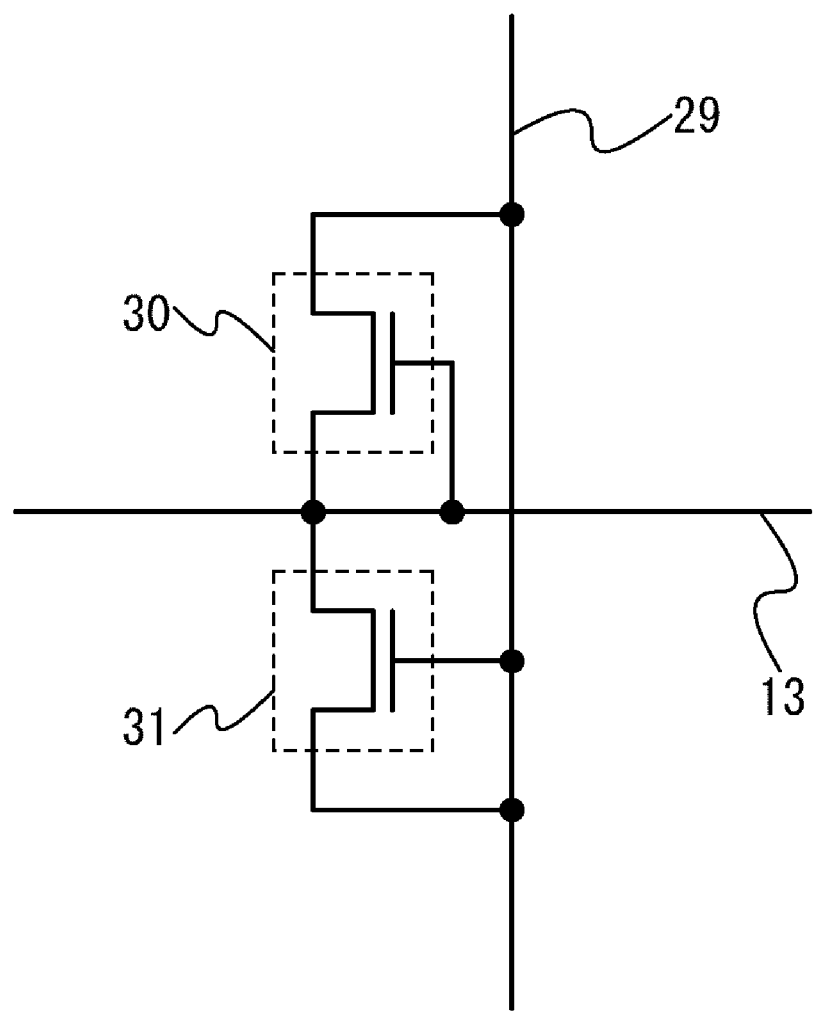
FIG. 2 illustrates an example of an equivalent circuit of a protective circuit.

FIG. 2 illustrates an example of the protective circuit 24. This protective circuit 24 includes a non-linear element 30 and a non-linear element 31 which are arranged in parallel between the scan line 13 and the common wiring 29. Each of the non-linear element 30 and the non-linear element 31 is a two-terminal element such as a diode or a three-terminal element such as a transistor. For example, the transistor used as the non-linear element can be formed through the same steps as the pixel transistor of the pixel portion. For example, characteristics similar to those of a diode can be obtained by connecting a gate terminal to a drain terminal of the transistor.

A first terminal (gate) and a third terminal (drain) of the non-linear element 30 are connected to the scan line 13, and a second terminal (source) thereof is connected to the common wiring 29. A first terminal (gate) and a third terminal (drain) of the non-linear element 31 are connected to the common wiring 29, and a second terminal (source) thereof is connected to the scan line 13. That is, the protective circuit illustrated in FIG. 2 includes two transistors whose rectifying directions are opposite to each other and each of which connect the scan line 13 and the common wiring 29. In other words, the protective circuit has a structure in which between the scan line 13 and the common wiring 29, a transistor whose rectifying direction is from the scan line 13 to the common wiring 29 and a transistor whose rectifying direction is from the common wiring 29 to the scan line 13 are connected.

In the protective circuit illustrated in FIG. 2, when the scan line 13 is charged positively or negatively with respect to the common wiring 29 due to static electricity or the like, current flows in a direction that cancels the charge. For example, if the scan line 13 is positively charged, current flows in a direction in which the positive charge is released to the common wiring 29. Owing to this operation, electrostatic breakdown or a shift in the threshold voltage of the pixel transistor 19 connected to the charged scan line 13 can be prevented. Moreover, it is possible to prevent dielectric breakdown of an insulating layer between the charged scan line 13 and another wiring that intersects with the charged scan line 13 with the insulating layer interposed therebetween.

Figure 3:
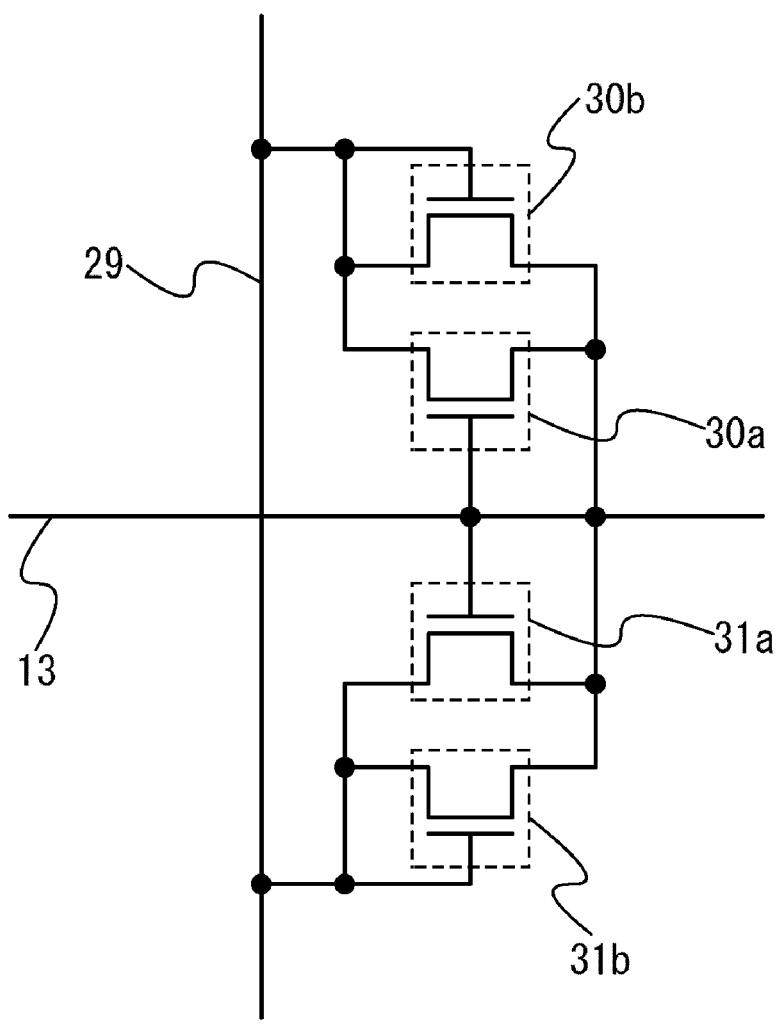
FIG. 3 illustrates an example of an equivalent circuit of a protective circuit.
Figure 9A:
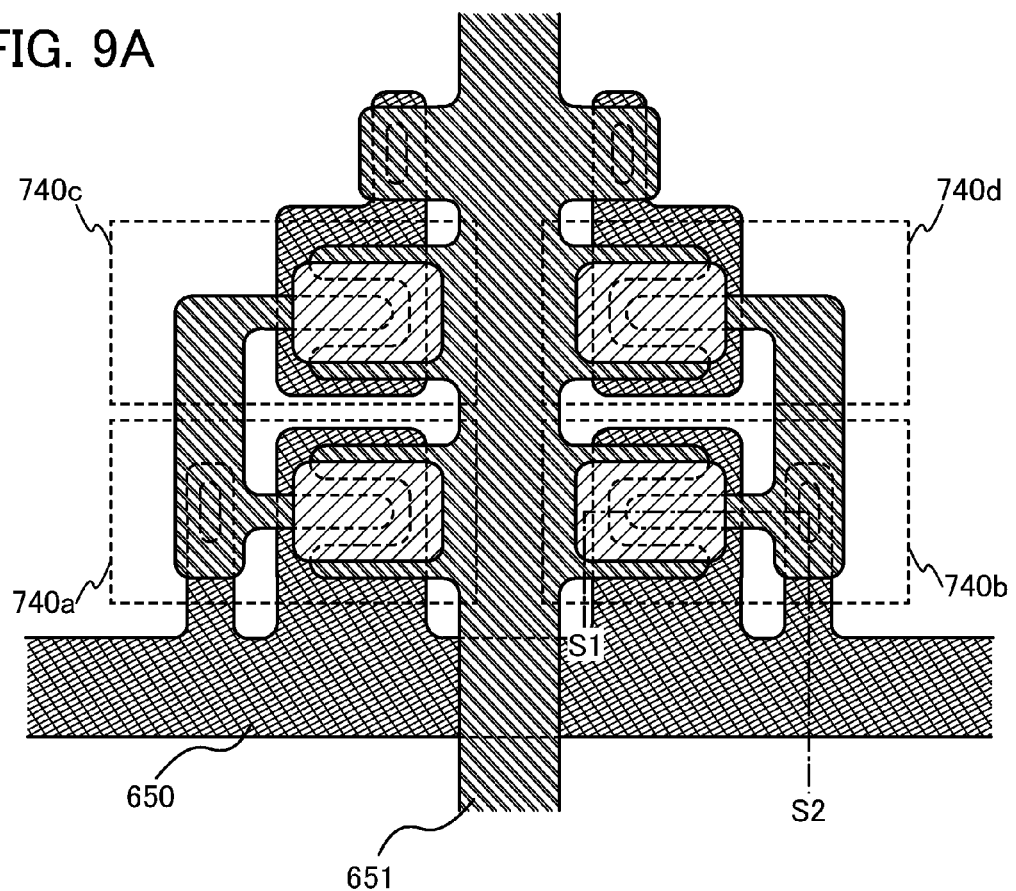
FIGS. 9A and 9B are examples of a plan view and an equivalent circuit of a protective circuit, respectively.
Figure 9B:
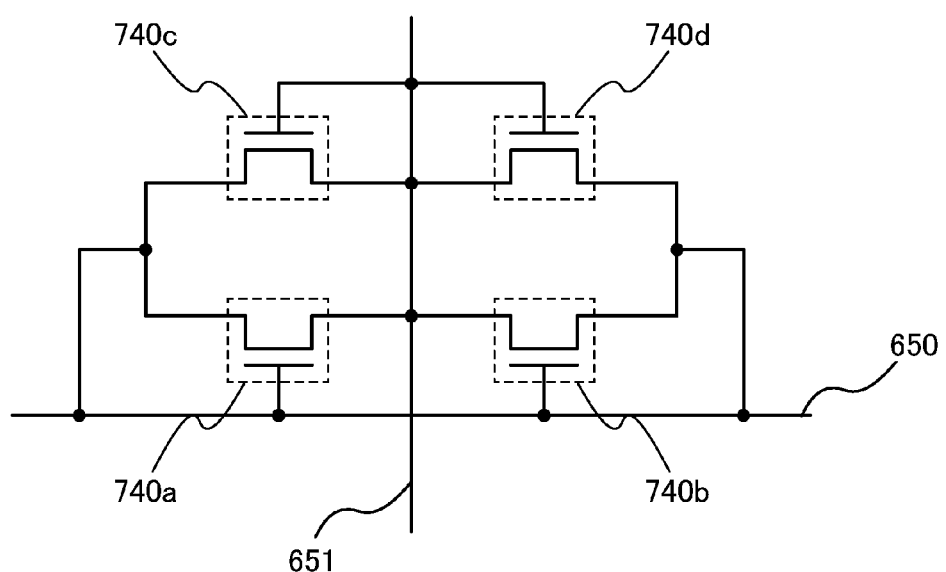

Note that in FIG. 2, a pair of the non-linear elements the rectifying directions of which are opposite to each other are used: the non-linear element 30 whose first terminal (gate) is connected to the scan line 13 and the non-linear element 31 whose first terminal (gate) is connected to the common wiring 29. The common wiring 29 and the scan line 13 are connected via the second terminal (source) and the third terminal (drain) of each non-linear element; that is, the non-linear element 30 and the non-linear element 31 are in parallel. As another structure, a non-linear element may be further added in parallel connection, so that the operation stability of the protective circuit can be enhanced. For example, FIG. 3 illustrates a protective circuit including a non-linear element 30a and a non-linear element 30b, and a non-linear element 31a and a non-linear element 31b, which is provided between the scan line 13 and the common wiring 29. This protective circuit includes four non-linear elements in total: two non-linear elements (30b and 31b) each having a first terminal (gate) and a third terminal which are connected to the common wiring 29 and a second terminal which is connected to the scan line 13, and two non-linear elements (30a and 31a) each having a first terminal (gate) and a third terminal which are connected to the scan line 13 and a second terminal which is connected to the common wiring 29. That is to say, two pairs of non-linear elements are connected between the common wiring 29 and the scan line 13, each pair including two non-linear elements provided so that their rectifying directions are opposite to each other. In other words, between the scan line 13 and the common wiring 29, there are two transistors, rectifying direction of which are from the scan line 13 to the common wiring 29 and two transistors, rectifying direction of which are from the common wiring 29 to the scan line 13. When the common wiring 29 and the scan line 13 are connected to each other with the four non-linear elements in this manner, it is possible to prevent the charge from directly flowing through the scan line 13, even if surge voltage is applied to the scan line 13 and moreover even if the common wiring 29 is charged by static electricity or the like. Note that FIG. 9A illustrates an example in which four non-linear elements are provided over a substrate and FIG. 9B is an equivalent circuit diagram thereof. The equivalent circuit diagram of FIG. 9B is equivalent to that of FIG. 3, and the non-linear elements illustrated in FIG. 9B correspond to the non-linear elements illustrated in FIG. 3. Specifically, the non-linear element 740a corresponds to the non-linear element 30b; the non-linear element 740b, the non-linear element 31b; the non-linear element 740c, the non-linear element 30a; and the non-linear element 740d, the non-linear element 31a. Moreover, a scan line 651 and a common wiring 650 in FIGS. 9A and 9B correspond to the scan line 13 and the common wiring 29 in FIG. 3, respectively. Accordingly, the example of the protective circuit illustrated in FIG. 9A in which four non-linear elements are provided over a substrate is another example of the protective circuit illustrated in FIG. 3.

Figure 8A:
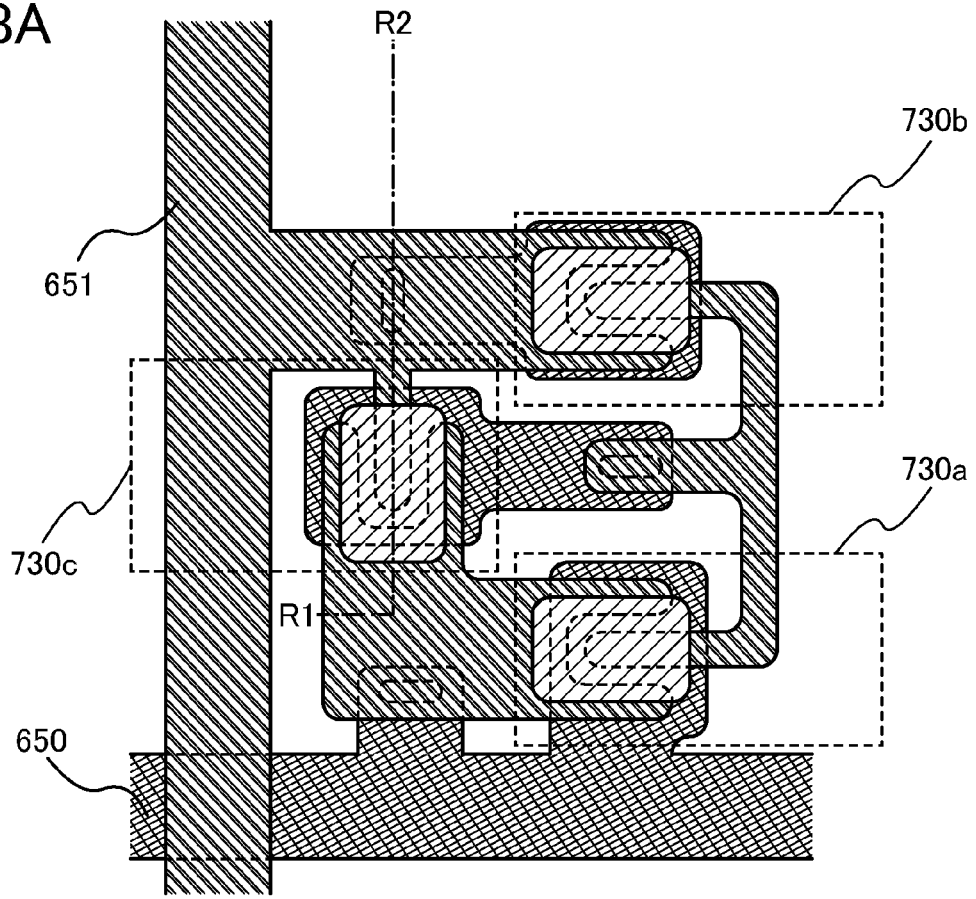
FIGS. 8A and 8B are examples of a plan view and an equivalent circuit of a protective circuit, respectively.
Figure 8B:
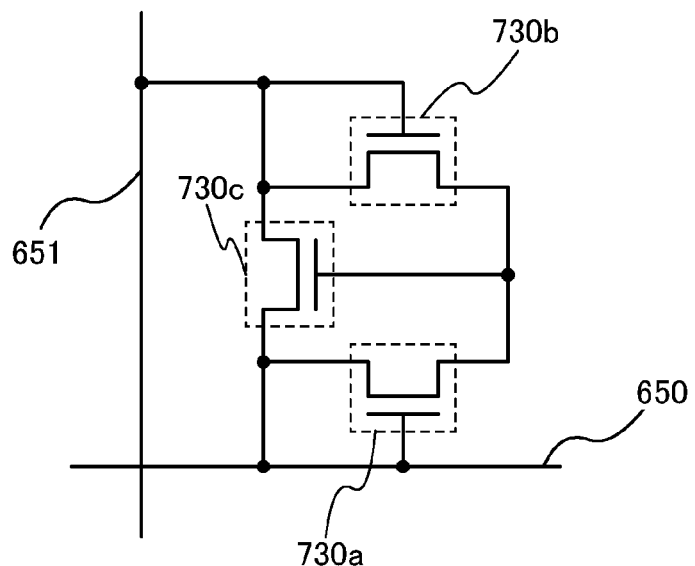

FIG. 8A illustrates an example of a protective circuit which is formed using an odd number of non-linear elements over a substrate, and FIG. 8B is an equivalent circuit diagram thereof. In this circuit, a non-linear element 730b and a non-linear element 730a are connected to a non-linear element 730c to serve as switching elements. By the serial connection of the non-linear elements in this manner, instantaneous load applied to the non-linear elements of the protective circuit can be deconcentrated.

FIG. 2 illustrates an example of the protective circuit 24. However, a protective circuit with a similar structure can be applied to the protective circuit 25 and the protective circuit 26.

Figure 4A:
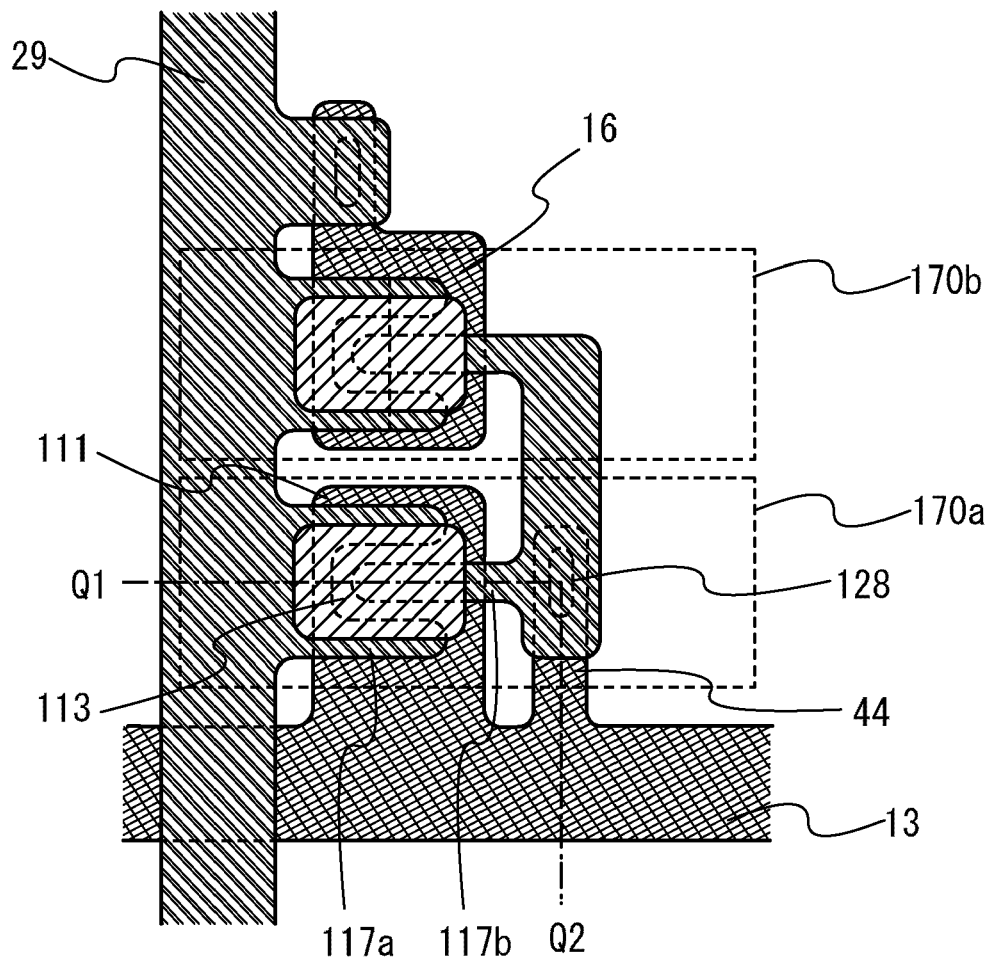
FIGS. 4A and 4B are examples of a plan view and an equivalent circuit of a protective circuit, respectively.
Figure 4B:
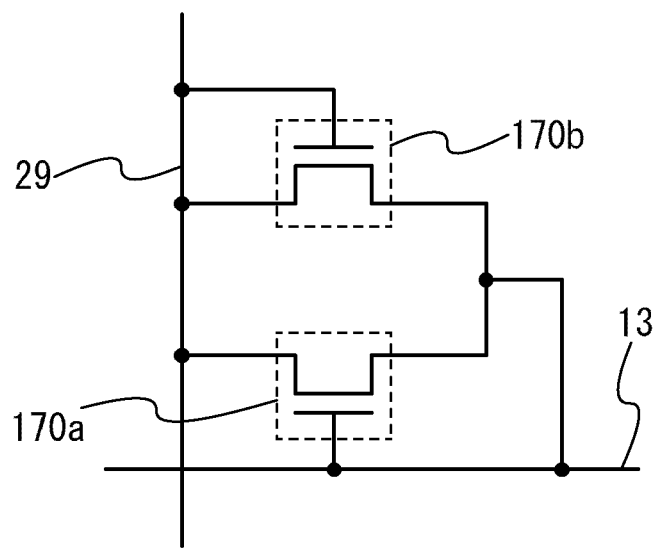
Figure 5:
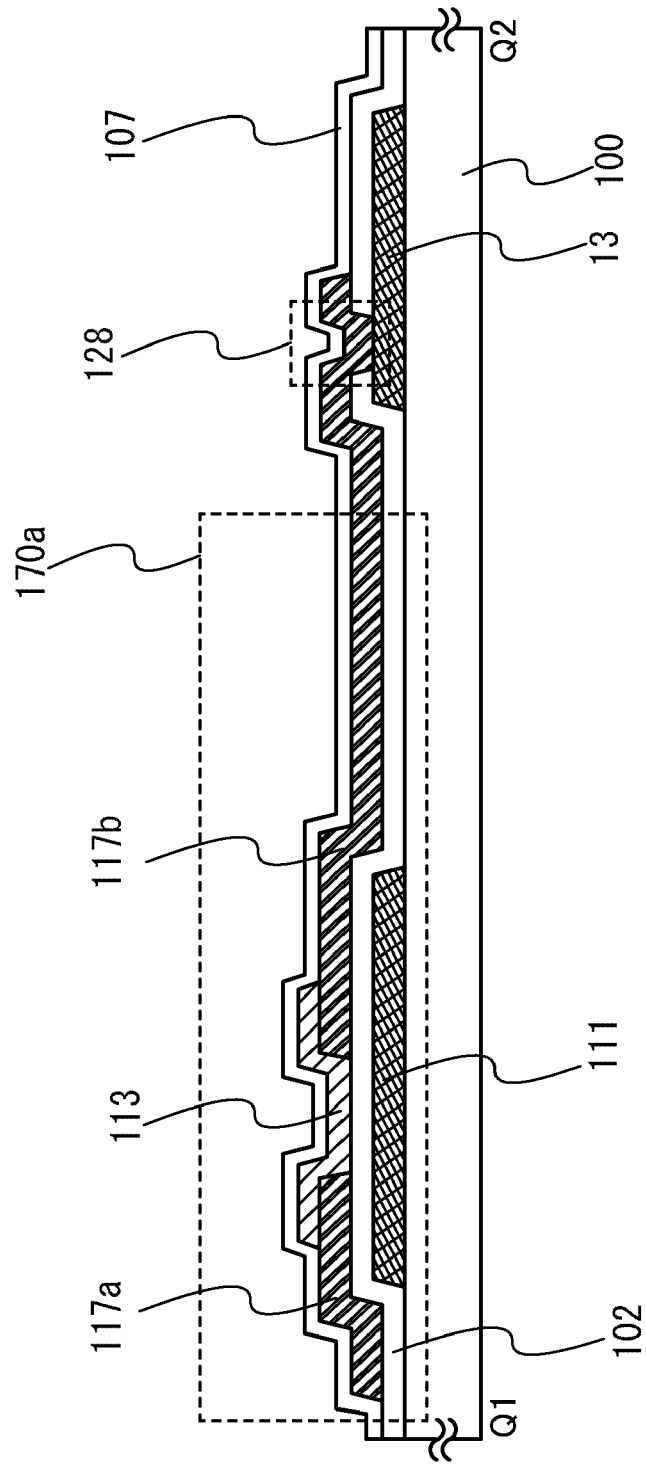
FIG. 5 is a cross-sectional view illustrating an example of a protective circuit.

FIG. 4A is a plan view illustrating an example of the protective circuit 24 and FIG. 4B is an equivalent circuit diagram thereof. FIG. 5 is a cross-sectional view taken along line Q1-Q2 of FIG. 4A. A structure example of the protective circuit 24 is described below with reference to FIGS. 4A and 4B and FIG. 5.

A non-linear element 170a and a non-linear element 170b respectively include a gate electrode 111 and a gate electrode 16, which are formed using the same layer as the scan line 13. A gate insulating film 102 is formed over the gate electrode 111 and the gate electrode 16. Over the gate insulating film 102, a first wiring layer 117a and a second wiring layer 117b are provided so as to face each other over the gate electrode 111. Note that main parts of the non-linear element 170a and the non-linear element 170b have the same structure to each other.

In this embodiment of the present invention, the scan line 13 formed with the same layer as the gate electrode 111 and a third terminal (drain) of the non-linear element 170a are directly connected through a contact hole 128 provided in the gate insulating film 102. Thus, the number of interfaces required for connecting the scan line 13 and the third terminal can be reduced to one, and the number of contact holes required for connecting the scan line 13 and the third terminal can be reduced to one.

An oxide semiconductor layer 113 is provided to cover a portion between the first wiring layer 117a and the second wiring layer 117b facing each other over the gate electrode 111. In other words, the oxide semiconductor layer 113 is provided to overlap with the gate electrode 111 and be in contact with the gate insulating film 102 and the first and second wiring layers 117a and 117b.

Electrical conductivity of an oxide semiconductor film varies depending on conditions of film formation. Here, an oxide semiconductor film is formed under a condition where the film has high oxygen concentration, so that electrical conductivity of the film is made lower. Moreover, lowering electrical conductivity enables off current to be reduced; thus, a thin film transistor with a high on/off ratio can be provided.

In this specification, a thin film including a material whose composition formula is represented as $InMO_3(ZnO)_m$ (m>0) is formed as an oxide semiconductor film, and a non-linear element and a thin film transistor are formed using the thin film as a semiconductor layer. Note that M denotes metal element selected from the group consisting of Ga, Fe, Ni, Mn, and Co. In addition to a case where only Ga is contained as M, there is a case where M contains Ga and any of the above metal elements other than Ga, for example, Ga and Ni or Ga and Fe. Further, in some cases, the above oxide semiconductor contains a transition metal element such as Fe or Ni or an oxide of the transition metal as an impurity element in addition to the metal element which is contained as M. In this specification, this thin film is also referred to as an In—Ga—Zn—O based non-single-crystal film.

Table 1 shows a measurement result of an In—Ga—Zn—O based non-single-crystal film by an Inductively Coupled Plasma Mass Spectrometry (ICP-MS) method. An oxide semiconductor film of $InGa_{0.95}Zn_{0.41}O_{3.33}$ was obtained under Condition 1 where a flow rate of an argon gas in sputtering is set at 40 sccm, with use of a target (In:Ga:Zn=1:1:0.5) which contains indium oxide ($In_2O_3$), gallium oxide ($Ga_2O_3$), and zinc oxide (ZnO) at a ratio of 1:1:1 (=$In_2O_3$:$Ga_2O_3$:ZnO). Further, an oxide semiconductor film of $InGa_{0.94}Zn_{0.4}O_{3.31}$ was obtained under Condition 2 where flow rates of an argon gas and oxygen in sputtering are respectively set at 10 sccm and 5 sccm, with use of a target (In:Ga:Zn=1:1:0.5) which contains indium oxide ($In_2O_3$), gallium oxide ($Ga_2O_3$), and zinc oxide (ZnO) at a ratio of 1:1:1 (=$In_2O_3$:$Ga_2O_3$:ZnO).

TABLE 1

| Flow ratio | Composition (atomic %) | | | | Composition formula |
|---|---|---|---|---|---|
| $Ar/O_2$ | In | Ga | Zn | O | |
| 40/0 | 17.6 | 16.7 | 7.2 | 58.6 | $InGa_{0.95}Zn_{0.41}O_{3.33}$ |
| 10/5 | 17.7 | 16.7 | 7 | 58.6 | $InGa_{0.94}Zn_{0.40}O_{3.31}$ |

Table 2 shows a measurement result of quantification which is performed by a Rutherford Backscattering Spectrometry (RBS) method instead of an ICP-MS method.

TABLE 2

| Flow ratio | Composition (atomic %) | | | | | Composition formula |
|---|---|---|---|---|---|---|
| $Ar/O_2$ | In | Ga | Zn | O | Ar | |
| 40/0 | 17 | 15.8 | 7.5 | 59.4 | 0.3 | $InGa_{0.93}Zn_{0.44}O_{3.49}$ |
| 10/5 | 16 | 14.7 | 7.2 | 61.7 | 0.4 | $InGa_{0.92}Zn_{0.45}O_{3.86}$ |

As a result of measuring the sample of Condition 1 by RBS, a composition formula of the oxide semiconductor film is $InGa_{0.93}Zn_{0.44}O_{3.49}$. Further, as a result of measuring the sample of Condition 2 by RBS, a composition formula of the oxide semiconductor film is $InGa_{0.92}Zn_{0.45}O_{3.86}$.

By X-ray diffraction (XRD) spectrometry, an amorphous structure was observed in the In—Ga—Zn—O based non-single-crystal film. Note that In—Ga—Zn—O based non-single-crystal film of the examined sample is subjected to thermal treatment at 200° C. to 500° C., typically 300° C. to 400° C. for 10 minutes to 100 minutes after film formation by a sputtering method. Further, a thin film transistor having electric characteristics such as an on/off ratio of $10^9$ or higher and mobility of 10 $cm^2$/V·S or higher at a gate voltage of ±20 V can be manufactured.

An interlayer insulating film 107 is provided over the oxide semiconductor layer 113. The interlayer insulating film 107 is formed using an oxide such as silicon oxide or aluminum oxide. Moreover, silicon nitride, aluminum nitride, silicon oxynitride, or aluminum oxynitirde is stacked over silicon oxide or aluminum oxide, whereby function as a protective film of the interlayer insulating film 107 can be further enhanced.

In any case, the interlayer insulating film 107 being in contact with the oxide semiconductor layer 113 is an oxide layer, whereby it is possible to prevent oxygen from being extracted from the oxide semiconductor layer 113 and prevent the oxide semiconductor layer 113 from changing into an oxygen-deficiency type. Moreover, in the case of having a structure where the oxide semiconductor layer 113 is not in direct contact with an insulating layer including nitride, it is possible to prevent hydrogen in the nitride from diffusing and causing defects in the oxide semiconductor layer 113 due to a hydroxyl group or the like.

According to this embodiment, a display device including a protective circuit including an oxide semiconductor can be obtained. Further, the scan line 13 formed with the same layer as the gate electrode 111 and the third terminal (drain) of the non-linear element 170a are directly connected through the contact hole 128 provided in the gate insulating film 102, whereby only one interface is required for connecting the scan line 13 and the third terminal and only one contact hole is required for connecting the scan line 13 and the third terminal. As a result, in addition to enhancing function of the protective circuit and achieving stabilization of operation, an area occupied by the protective circuit is reduced so that reduction in size of the display device can be achieved. In particular, as the number of the non-linear elements included in the protective circuit is increased to three or four, effect of suppressing formation of interfaces and contact holes for connections is increased.

Note that although FIGS. 4A and 4B and FIG. 5 illustrate the example of the protective circuit 24, a similar protective circuit can be applied to the protective circuit 25 and the protective circuit 26.

This embodiment can be implemented in combination with the structure described in another embodiment, as appropriate.

Embodiment 2

In this embodiment, an example of a process for manufacturing the protective circuit illustrated in FIG. 4A described in Embodiment 1 is described with reference to FIGS. 6A to 6C and FIGS. 7A to 7C. FIGS. 6A to 6C and FIGS. 7A to 7C are cross-sectional views taken along line Q1-Q2 of FIG. 4A.

In FIG. 6A, a glass substrate of barium borosilicate glass, aluminoborosilicate glass, aluminosilicate glass, or the like available in the market can be used as a substrate 100 having a light-transmitting property. For example, a glass substrate which includes more barium oxide (BaO) than boric acid ($B_2O_3$) in composition ratio and whose strain point is 730° C. or higher is preferable. This is because such a glass substrate is not strained even in the case where the oxide semiconductor layer is thermally processed at high temperatures of about 700° C.

Next, a conductive film which is to be a gate wiring including the gate electrode 111 and the scan line 13, a capacitor wiring, and a terminal of a terminal portion is formed entirely over the substrate 100. The conductive film is desirably formed from a low-resistance conductive material such as aluminum (Al) or copper (Cu); however, since Al itself has disadvantages such as low heat resistance and a tendency to be corroded, it is used in combination with a conductive material having heat resistance. As a conductive material having heat resistance, an element selected from titanium (Ti), tantalum (Ta), tungsten (W), molybdenum (Mo), chromium (Cr), neodymium (Nd), or scandium (Sc), or an alloy including any of the elements, an alloy film including a combination of such elements, or a nitride film including any of the elements can be used.

The conductive film to be the gate wiring including the gate electrode 111 and the scan line 13 is formed to a thickness of from 50 nm to 300 nm inclusive. When the conductive film to be the gate wiring including the gate electrode 111 and the scan line 13 has a thickness of 300 nm or less, disconnection of a semiconductor film or a wiring formed later can be prevented. Further, when the conductive film to be the gate wiring including the gate electrode 111 and the scan line 13 has a thickness of 150 nm or more, resistance of the gate wiring can be reduced, and increase in size becomes possible.

Here, a film containing aluminum as its main component and a titanium film are stacked as the conductive film over an entire surface of the substrate 100 by a sputtering method.

Next, with use of a resist mask formed using a first photomask in this embodiment, an unnecessary portion of the conductive film formed over the substrate is removed by etching, so that a wiring and an electrode (a gate wiring including the gate electrode 111 and the scan line 13, a capacitor wiring, and a terminal) are formed. At this point, etching is performed so that at least an end portion of the gate electrode 111 can be tapered. FIG. 6A illustrates a cross-sectional view in this step.

Then, the gate insulating film 102 is formed. As an insulating film which can be used as the gate insulating film 102, a silicon oxide film, a silicon nitride film, a silicon oxynitride film, a silicon nitride oxide film, an aluminum oxide film, a magnesium oxide film, an aluminum nitride film, an yttrium oxide film, a hafnium oxide film, or a tantalum oxide film can be given as an example.

Here, a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The gate insulating film 102 may have a single-layer structure or a layered structure in which two or three insulating films are stacked. For example, when a gate insulating film in contact with the substrate is formed using a silicon nitride film or a silicon nitride oxide film, adhesion between the substrate and the gate insulating film is increased, and in the case of using a glass substrate as the substrate, impurities from the substrate can be prevented from diffusing into the oxide semiconductor layer and oxidation of the gate wiring including the gate electrode 111 and the scan line 13 can be prevented. That is, film peeling can be prevented, and electric characteristics of a thin film transistor to be completed later can be improved.

The thickness of the gate insulating film 102 is 50 nm to 250 nm. The gate insulating film with a thickness of 50 nm or more can cover projections and depressions of the gate wiring including the gate electrode 111 and the scan line 13, which is preferable. Here, a 100-nm-thick silicon oxide film is formed as the gate insulating film 102 by a plasma CVD method or a sputtering method.

Next, the gate insulating film 102 is etched with use of a resist mask formed using a second photomask in this embodiment, so that the contact hole 128 reaching the scan line 13 is formed. FIG. 6B illustrates a cross-sectional view in this step.

Next, a conductive film which is to be source and drain electrode layers is formed by a sputtering method or a vacuum evaporation method. As the material of the conductive film, there are an element selected from Al, Cr, Ta, Ti, Mo, or W, an alloy including the above element, an alloy film in which some of the above elements are combined, and the like.

When thermal treatment is conducted at 200° C. to 600° C., the conductive film preferably has a heat resistant property so as to endure this thermal treatment. Since aluminum itself has disadvantages such as low heat resistance and a tendency to be corroded, it is used in combination with a conductive material having heat resistance. As a conductive material having heat resistance, which is to be used in combination with Al, an element selected from titanium (Ti), tantalum (Ta), tungsten (W), molybdenum (Mo), chromium (Cr), neodymium (Nd), or scandium (Sc), or an alloy including any of the elements, an alloy film including a combination of such elements, or a nitride film including any of the elements can be used.

Here, the conductive film has a three-layer structure in which a Ti film is formed, an aluminum film including Nd, an Al—Nd film, is stacked over the Ti film, and another Ti film is stacked thereover. Alternatively, the conductive film may have a two-layer structure in which a titanium film is stacked over an aluminum film. Further alternatively, the conductive film may have a single-layer structure of an aluminum film including silicon or a titanium film.

Note that since the contact hole 128 is formed in the gate insulating film 102, the conductive film 105 which is to be source and drain electrode layers is connected to the scan line 13 through the contact hole 128 at the same time as the formation.

Next, a resist mask 131 is formed over the conductive film using a third photomask in this embodiment, and an unnecessary portion of the conductive film is removed by etching. Thus, source and drain electrode layers (117a and 117b) are formed. At this time, dry etching or wet etching can be used as the etching. Here, dry etching is employed using a mixed gas of $SiCl_4$, $Cl_2$, and $BCl_3$ to etch the conductive film in which the Ti film, the Al—Nd film, and the Ti film are stacked, so that the source and drain electrode layers (117a and 117b) are formed. FIG. 6C illustrates a cross-sectional view in this step.

After the resist mask is removed, plasma treatment is performed. Here, reverse sputtering where plasma is generated after introduction of an oxygen gas and an argon gas is performed, so that the exposed gate insulating film is subjected to treatment using oxygen radicals or oxygen. Thus, dust adhering to the surface is removed. FIG. 7A illustrates a cross-sectional view in this step.

Next, an oxide semiconductor film is formed in such a manner that the substrate which has been subjected to plasma treatment is not exposed to air. Formation of the oxide semiconductor film in such a manner after plasma treatment can avoid the trouble that dust or moisture adheres to the interface between the gate insulating film 102 and the oxide semiconductor film. The oxide semiconductor film may be formed in the same chamber as the chamber where the reverse sputtering is performed previously, or may be formed in a different chamber from the chamber where the reverse sputtering is performed previously as long as the film formation can be performed without exposure to air.

Here, the oxide semiconductor film is formed in an oxygen atmosphere (or a flow rate of oxygen gas is equal to or more than a flow rate of argon gas) under the condition where the oxide semiconductor target including In, Ga, and Zn (composition ratio is $In_2O_3:Ga_2O_3:ZnO=1:1:1$) with a diameter of 8 inches is used, the distance between the substrate and the target is set at 170 mm, the pressure is set at 0.4 Pa, and the direct current (DC) power supply is set at 0.5 kW. Note that a pulse direct current (DC) power supply is preferable because dust can be reduced and the film thickness can be uniform. The thickness of the oxide semiconductor film is set to 5 nm to 200 nm. The thickness of the oxide semiconductor film in this embodiment is 100 nm.

The oxide semiconductor film is formed under a condition where the film has high oxygen concentration, so that electrical conductivity of the film is made lower. Moreover, when the oxide semiconductor film is formed to contain a large amount of oxygen, the amount of off current can be reduced; therefore, a thin film transistor with a high on/off ratio can be provided.

Then, thermal treatment at 200° C. to 600° C., typically 300° C. to 500° C., is preferably performed. In this case, thermal treatment is performed in a furnace at 350° C. for an hour in a nitrogen atmosphere or an air atmosphere. This thermal treatment allows atoms of the In—Ga—Zn—O based non-single-crystal film to be rearranged. Since the distortion that interrupts carrier movement is released by this thermal treatment, the thermal treatment at this time (including photo-annealing) is important. There is no particular limitation on when to perform the thermal treatment as long as it is performed after the formation of the oxide semiconductor film; for example, it may be performed after the formation of the pixel electrode.

Next, a resist mask is formed using a fourth photomask in this embodiment, and an unnecessary portion of the oxide semiconductor film is removed by etching, so that the oxide semiconductor layer 113 is formed. Here, wet etching is performed with use of ITO07N (product of Kanto Chemical Co., Inc.) to remove the unnecessary portion of the semiconductor oxide film; thus, the oxide semiconductor layer 113 is formed. Note that the etching here may be dry etching, without being limited to wet etching. Through the above steps, the non-linear element 170a in which the oxide semiconductor layer 113 is a channel formation region can be formed. FIG. 7B illustrates a cross-sectional view in this step.

Furthermore, plasma treatment may be performed on the oxide semiconductor layer 113. Plasma treatment can repair damage of the oxide semiconductor layer 113 due to etching. The plasma treatment is preferably performed in an atmosphere of $O_2$ or $N_2O$, or more preferably an atmosphere of $N_2$, He, or Ar containing oxygen. Alternatively, the plasma treatment may be performed in an atmosphere in which $Cl_2$ or $CF_4$ is added to the above atmosphere. Note that the plasma treatment is preferably performed with non-bias applied.

Next, an interlayer insulating film 107 covering the non-linear element 170a is formed. The interlayer insulating film 107 can be formed using a silicon nitride film, a silicon oxide film, a silicon oxynitride film, an aluminum oxide film, a tantalum oxide film, or the like by a sputtering method or the like. As described above, through four photolithography processes with use of four photomasks, a protective circuit including a plurality of non-linear elements (two non-linear elements 170a and 170b in this embodiment) can be completed.

A pixel electrode is formed to be connected to a thin film transistor which is formed by the same process as the non-linear element in a pixel portion of a display device, following the formation of the protective circuit. Note that the thin film transistor in the pixel portion is not illustrated. With use of a fifth resist mask, a contact hole reaching a drain electrode of the thin film transistor in the pixel portion is formed in the interlayer insulating film 107. A cross-sectional view at this stage is illustrated in FIG. 7C.

Then, the resist mask is removed, and a transparent conductive film is formed. As a material for the transparent conductive film, indium oxide ($In_2O_3$), indium oxide-tin oxide alloy ($In_2O_3$—$SnO_2$, abbreviated to ITO), or the like can be given, and the transparent conductive film can be formed by a sputtering method, a vacuum evaporation method, or the like. Etching treatment of such materials is performed using a chlorinated acid based solution. However, since etching of ITO particularly tends to leave residue, an alloy of indium oxide-zinc oxide ($In_2O_3$—ZnO) may be used in order to improve etching processability.

Next, a sixth photolithography process is performed. A resist mask is formed, and an unnecessary portion of the transparent conductive film is removed by etching, so that the pixel electrode is formed. In addition, a capacitor wiring and the pixel electrode form a storage capacitor by using the gate insulating film 102 and the interlayer insulating film 107 as dielectrics in a capacitor portion. Moreover, the transparent conductive film is left in the terminal portion to form an electrode or a wiring used for connection with an FPC or to form a terminal electrode for connection which serves as an input terminal of a source wiring.

In such a manner, the pixel electrodes and a plurality of thin film transistors which are formed by the same process as the non-linear element can be formed in the pixel portion, thereby, the pixel portion including n-channel TFTs and the protective circuit can be manufactured at the same time. The scan line 13 formed with the same layer as the gate electrode 111 is directly connected to the third terminal (drain) of the non-linear element 170a through the contact hole 128 provided in the gate insulating film 102, whereby only one interface is required for forming one connection and only one contact hole is required for forming one connection. As a result, in addition to enhancing the function of the protective circuit and achieving stabilization of operation, an area occupied by the protective circuit is reduced, so that reduction in size of the display device can be achieved. In other words, in accordance with the steps described in this embodiment, in addition to enhancing the function of the protective circuit and achieving stabilization of operation, a board for an active-matrix display device, on which a protective circuit with small occupied area is mounted can be manufactured.

This embodiment can be implemented in combination with the structure described in another embodiment, as appropriate.

Embodiment 3

This embodiment illustrates an example of an electronic paper in which a protective circuit and a thin film transistor disposed in a pixel portion are provided over one substrate, as a display device to which an embodiment of the present invention is applied.

Figure 10:
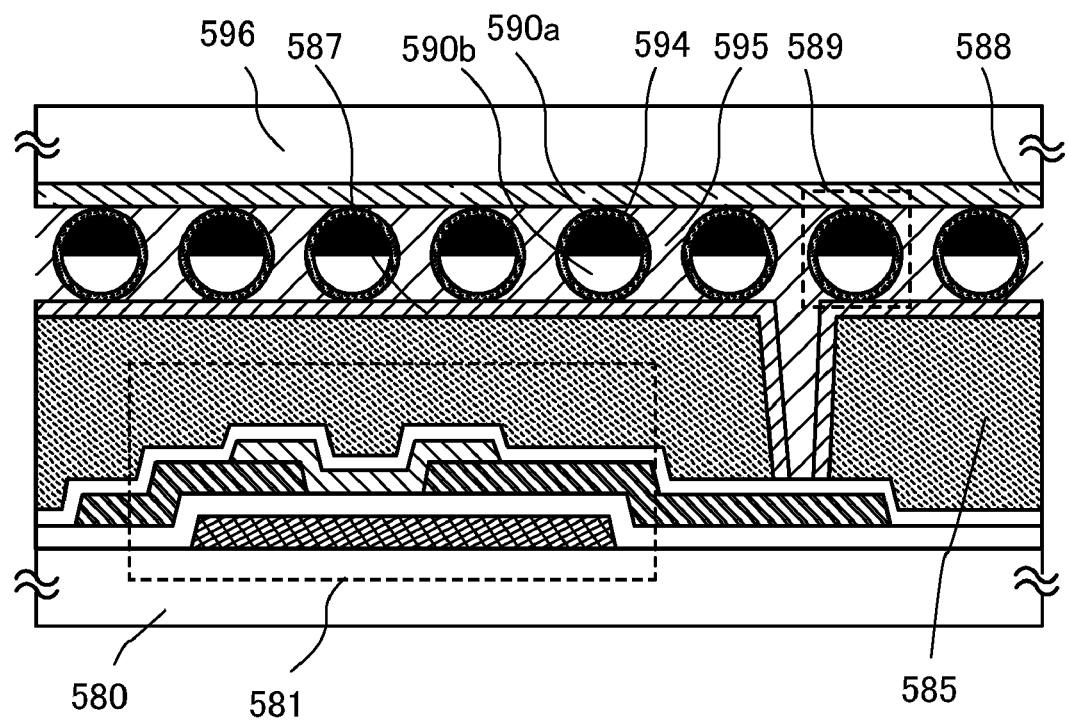
FIG. 10 is a cross-sectional view of an electronic paper.

FIG. 10 illustrates an active matrix type electronic paper as an example of a display device to which an embodiment of the present invention is applied. A thin film transistor 581 used for a semiconductor device can be manufactured in a manner similar to the non-linear element described in Embodiment 2, which is a thin film transistor including an oxide semiconductor containing In, Ga, and Zn as a semiconductor layer and having excellent electric characteristics.

The electronic paper of FIG. 10 is an example of a display device in which a twisting ball display system is employed. The twisting ball display system refers to a method in which spherical particles each colored in black and white are used for a display element and arranged between a first electrode layer and a second electrode layer which are electrode layers, and a potential difference is generated between the first electrode layer and the second electrode layer to control orientation of the spherical particles, so that display is performed.

The thin film transistor 581 interposed between a substrate 580 and a substrate 596 is a bottom-gate structure in which the source electrode layer or the drain electrode layer is electrically connected to a first electrode layer 587 through an opening formed in an insulating layer 585. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The circumference of the spherical particle 589 is filled with filler 595 such as a resin or the like (see FIG. 10).

Further, instead of the twisting ball, an electrophoretic element can be used. A microcapsule having a diameter of about 10 μm to 20 μM, which is filled with transparent liquid, positively-charged white microparticles and negatively-charged black microparticles, is used. In the microcapsule which is provided between the first electrode layer and the second electrode layer, when an electric field is applied by the first electrode layer and the second electrode layer, the white microparticles and the black microparticles move to opposite sides to each other, so that white or black can be displayed. A display element using this principle is an electrophoretic display element, and is called electronic paper in general. The electrophoretic display element has higher reflectance than a liquid crystal display element, and thus, an assistant light is unnecessary. Moreover, power consumption is low and a display portion can be recognized in a dusky place. Furthermore, an image which is displayed once can be retained even when power is not supplied to the display portion. Accordingly, a displayed image can be stored even though a semiconductor device having a display function (which is also referred to simply as a display device or a semiconductor device provided with a display device) is distanced from an electric wave source which serves as a power supply.

The thus manufactured electronic paper by the above steps is mounted with the protective circuit. The protective circuit includes a non-linear element in which the conductive layer of the first wiring layer or the second wiring layer is directly connected to the gate electrode or a wiring formed with the same layer as the gate electrode. Thus, operation of the protective circuit is stabilized, and an area occupied by the protective circuit is small. Accordingly, small-sized electric papers having high reliability can be manufactured.

This embodiment can be implemented in combination with the structure described in another embodiment, as appropriate.

Embodiment 4

This embodiment describes, with reference to FIGS. 11A and 11B, FIG. 12, FIG. 13, FIG. 14, FIG. 15, and FIG. 16, a display device which is an example of a semiconductor device according to an embodiment of the present invention. In that display device, at least a protective circuit, part of a driver circuit, and a thin film transistor in a pixel portion are formed over one substrate.

The thin film transistor in the pixel portion which is over the same substrate as the protective circuit is formed similarly to the non-linear element described in Embodiment 2. The thin film transistor is formed to be an n-channel TFT; therefore, part of a driver circuit which can be formed using n-channel TFTs is formed over the same substrate as the thin film transistor in the pixel portion.

Figure 11A:
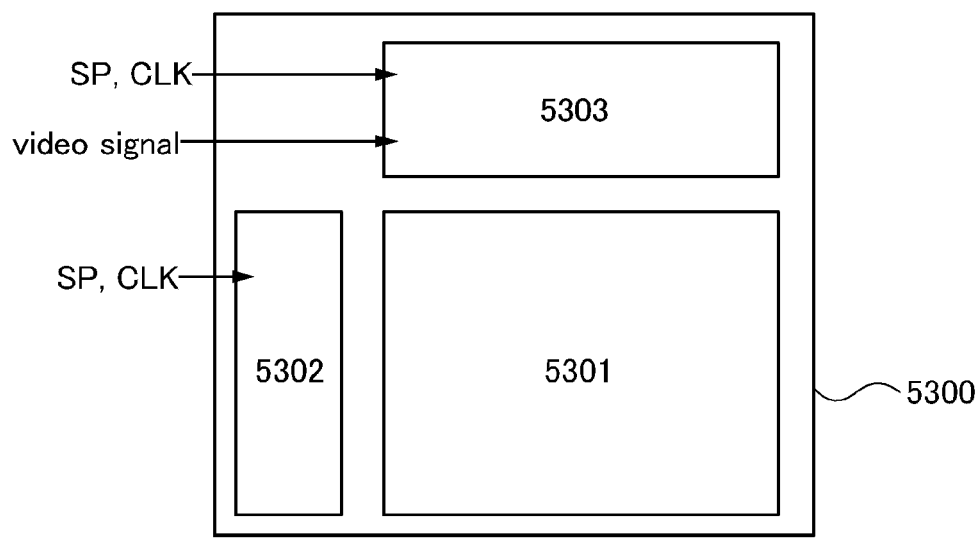
FIGS. 11A and 11B are each a block diagram of a semiconductor device.

FIG. 11A illustrates an example of a block diagram of an active matrix liquid crystal display device which is an example of a semiconductor device according to an embodiment of the present invention. The display device illustrated in FIG. 11A includes, over a substrate 5300, a pixel portion 5301 including a plurality of pixels each provided with a display element; a scan line driver circuit 5302 that selects a pixel; and a signal line driver circuit 5303 that controls a video signal input to the selected pixel.

The pixel portion 5301 is connected to the signal line driver circuit 5303 with a plurality of signal lines S1 to Sm (not shown) extending in a column direction from the signal line driver circuit 5303 and connected to the scan line driver circuit 5302 with a plurality of scan lines G1 to Gn (not shown) extending in a row direction from the scan line driver circuit 5302. The pixel portion 5301 includes a plurality of pixels (not shown) arranged in matrix corresponding to the signal lines S1 to Sm and the scan lines G1 to Gn. In addition, each of the pixels is connected to a signal line Sj (any one of the signal lines S1 to Sm) and a scan line Gi (any one of the scan lines G1 to Gn).

Further, n-channel TFTs can be formed by a method similar to the method for forming the non-linear element and together with the non-linear element described in Embodiment 2. A signal line driver circuit including n-channel TFTs is described with reference to FIG. 12.

Figure 12:
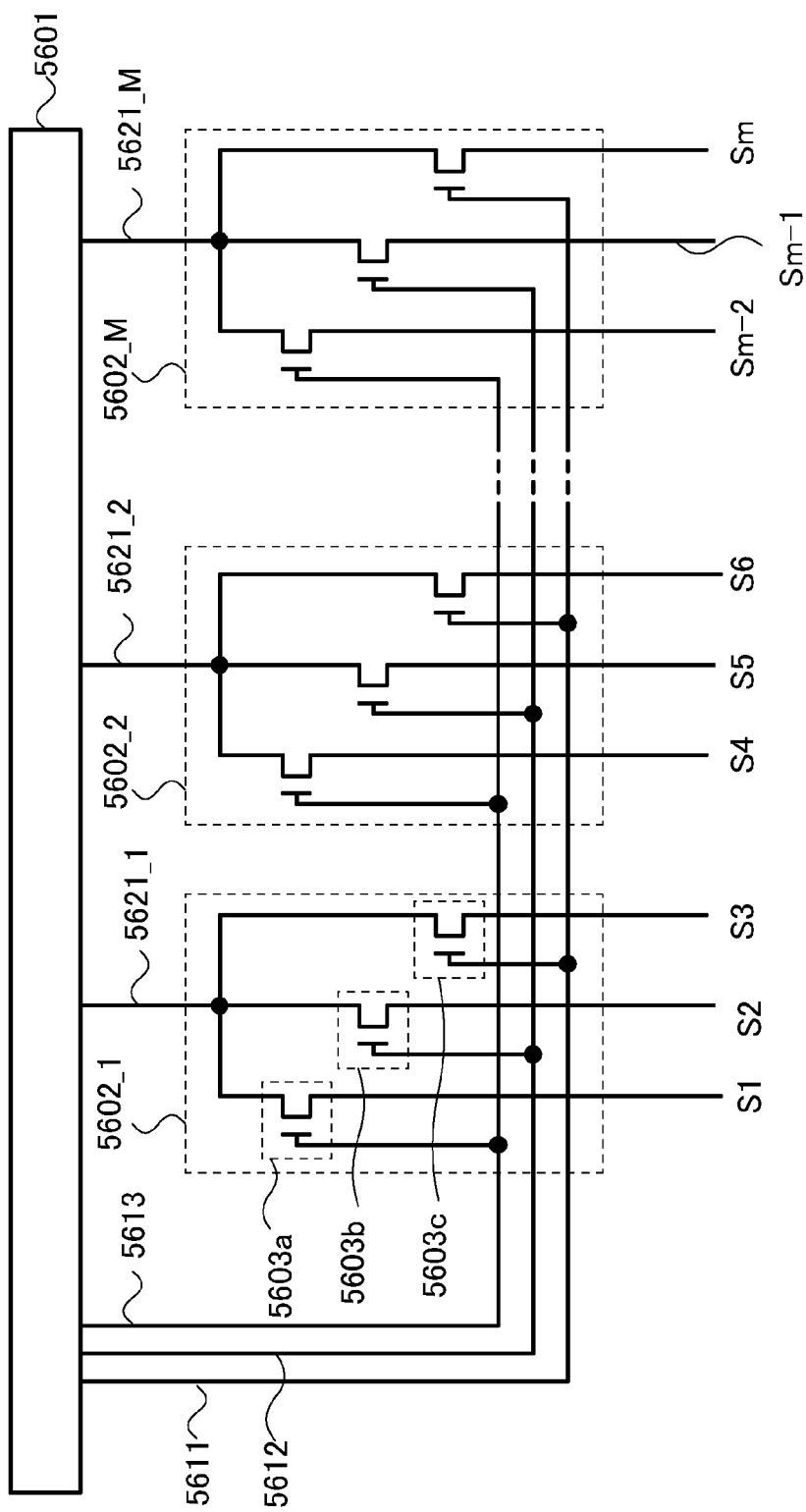
FIG. 12 illustrates a structure of a signal line driver circuit.

The signal line driver circuit of FIG. 12 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613. In addition, the switch groups 5602_1 to 5602_M are connected to the wirings 5621_1 to 5621_M, respectively. Each of the wirings 5621_1 to 5621_M is connected to three signal lines through the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 through the first thin film transistor 5603a, the second thin film transistor 5603b, and the third thin film transistor 5603c of the switch group 5602_J.

Note that a signal is input to each of the first wiring 5611, the second wiring 5612, and the third wiring 5613.

Note that the driver IC 5601 is preferably formed on a single-crystal substrate. The switch groups 5602_1 to 5602_M are preferably formed over the same substrate as the pixel portion. Therefore, the driver IC 5601 is preferably connected to the switch groups 5602_1 to 5602_M through an FPC or the like.

Figure 13:
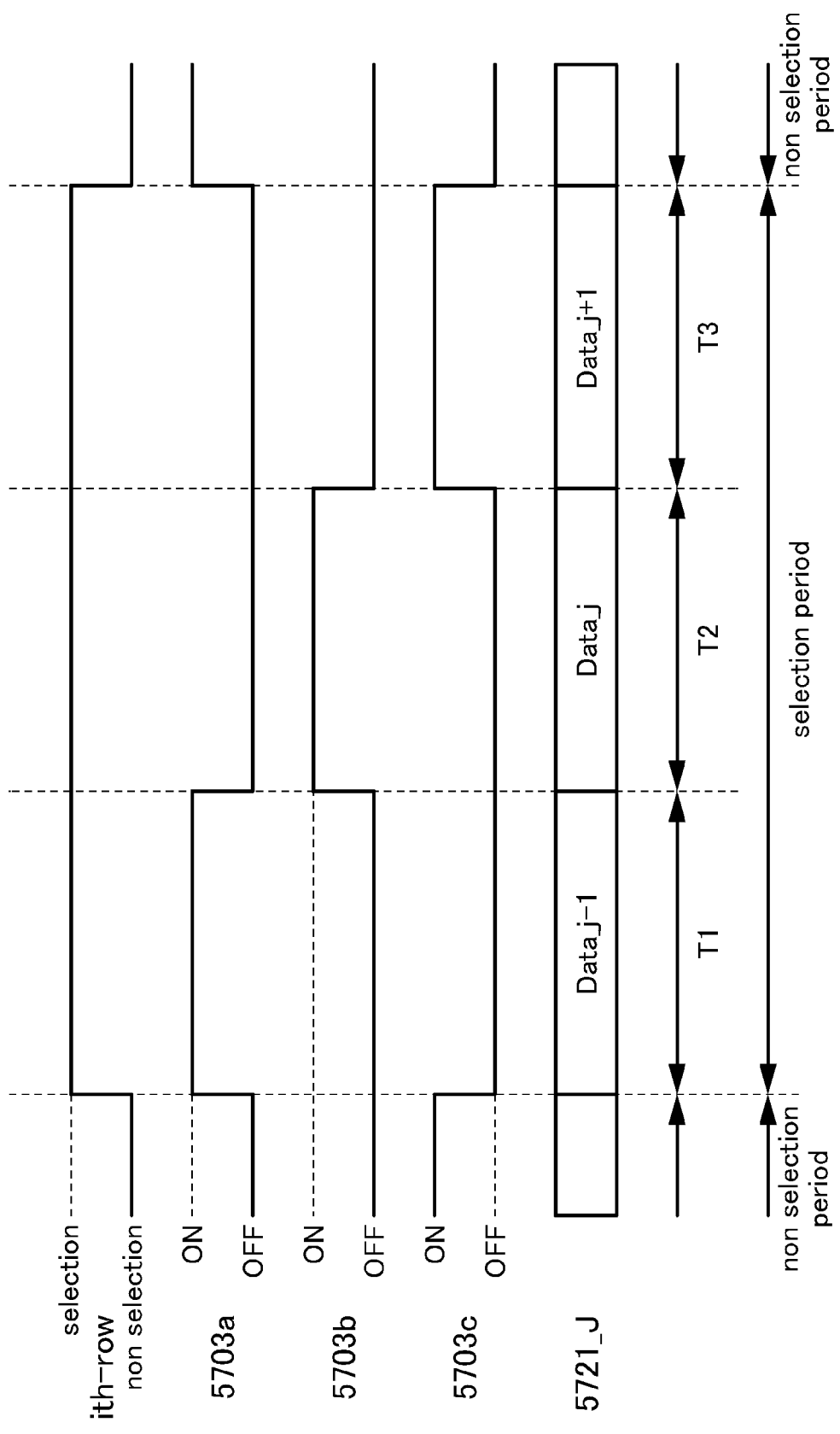
FIG. 13 is a timing chart of operation of a signal line driver circuit.

Next, operation of the signal line driver circuit of FIG. 12 is described with reference to a timing chart of FIG. 13. FIG. 13 illustrates the timing chart where a scan line Gi in the i-th row is selected. A selection period of the scan line Gi in the i-th row is divided into a first sub-selection period T1, a second sub-selection period T2, and a third sub-selection period T3. In addition, the signal line driver circuit of FIG. 12 operates similarly to FIG. 13 when a scan line in another row is selected.

Note that the timing chart of FIG. 13 shows the case where the wiring 5621_J in the J-th column is connected to the signal line Sj−1, the signal line Sj, and the signal line Sj+1 through the first thin film transistor 5603a, the second thin film transistor 5603b, and the third thin film transistor 5603c.

The timing chart of FIG. 13 shows timing when the scan line Gi in the i-th row is selected, timing 5703a when the first thin film transistor 5603a is turned on/off, timing 5703b when the second thin film transistor 5603b is turned on/off, timing 5703c when the third thin film transistor 5603c is turned on/off, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. The video signals input to the wiring 5621_J in the first sub-selection period T1, the second sub-selection period T2, and the third sub-selection period T3 are denoted by Data_j−1, Data_j, and Data_j+1, respectively.

As shown in FIG. 13, in the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 through the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj through the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 through the third thin film transistor 5603c.

As described above, in the signal line driver circuit of FIG. 12, one gate selection period is divided into three; thus, video signals can be input to three signal lines from one wiring 5621 in one gate selection period. Therefore, in the signal line driver circuit of FIG. 12, the number of connections between the substrate provided with the driver IC 5601 and the substrate provided with the pixel portion can be reduced to approximately one third the number of signal lines. When the number of connections is reduced to approximately one third the number of signal lines, the reliability, yield, and the like of the signal line driver circuit of FIG. 12 can be improved.

Note that there is no particular limitation on the arrangement, number, driving method, and the like of the thin film transistors, as long as one gate selection period is divided into a plurality of sub-selection periods and video signals are input to a plurality of signal lines from one wiring in the respective sub-selection periods as shown in FIG. 12.

For example, when video signals are input to three or more signal lines from one wiring in the respective sub-selection periods, it is only necessary to add a thin film transistor and a wiring for controlling the thin film transistor. Note that when one gate selection period is divided into four or more sub-selection periods, one sub-selection period becomes short. Therefore, one gate selection period is preferably divided into two or three sub-selection periods.

Figure 14:
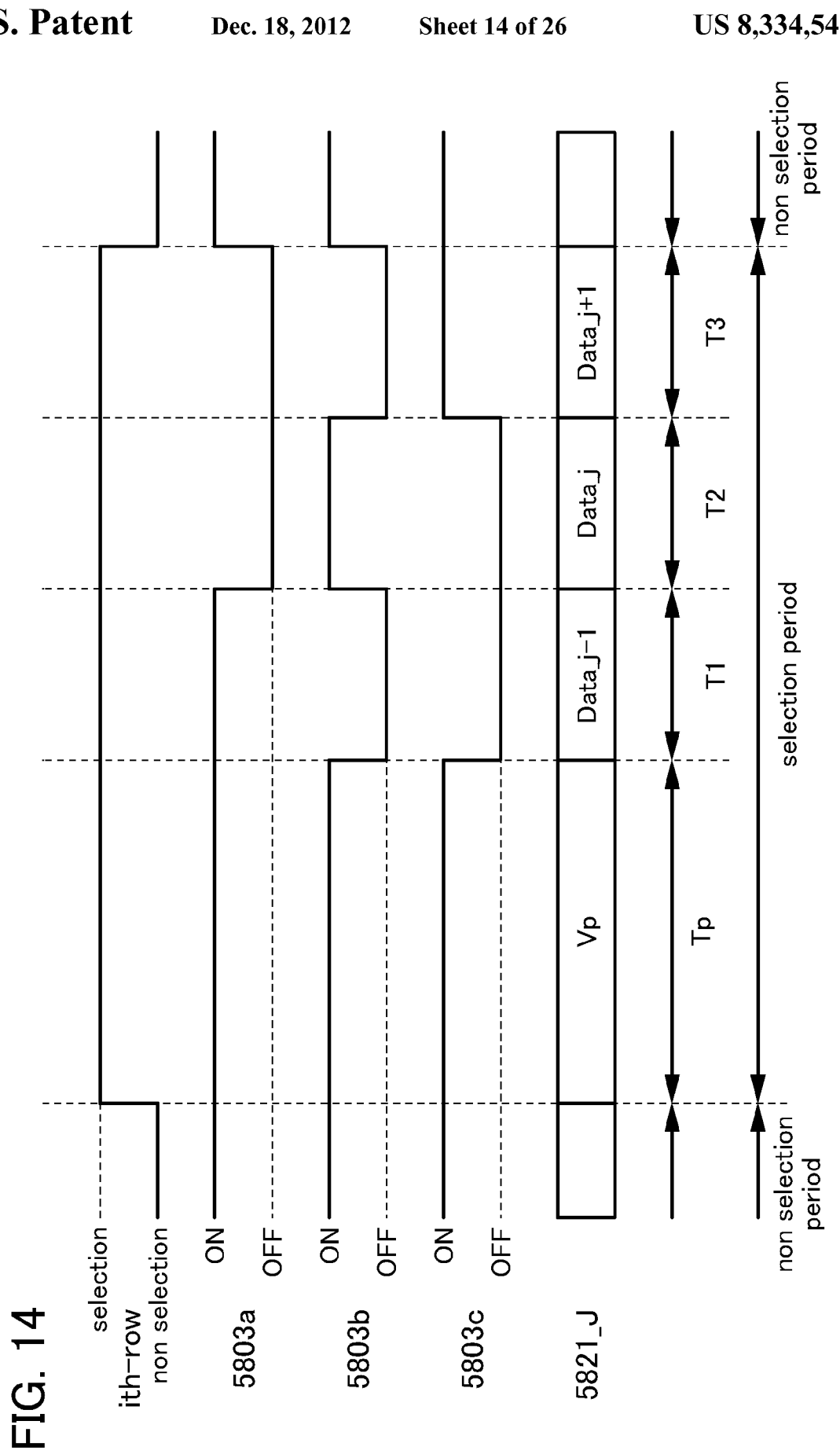
FIG. 14 is a timing chart of operation of a signal line driver circuit.

As another example, as shown in a timing chart of FIG. 14, one selection period may be divided into a precharge period Tp, the first sub-selection period T1, the second sub-selection period T2, and the third sub-selection period T3. The timing chart of FIG. 14 shows timing when the scan line Gi in the i-th row is selected, timing 5803a when the first thin film transistor 5603a is turned on/off, timing 5803b when the second thin film transistor 5603b is turned on/off, timing 5803c when the third thin film transistor 5603c is turned on/off, and a signal 5821_J input to the wiring 5621_J in the J-th column. As shown in FIG. 14, the first thin film transistor 5603a, the second thin film transistor 5603b, and the third thin film transistor 5603c are on in the precharge period Tp. At this time, a precharge voltage Vp input to the wiring 5621_J is input to the signal line Sj−1, the signal line Sj, and the signal line Sj+1 through the first thin film transistor 5603a, the second thin film transistor 5603b, and the third thin film transistor 5603c, respectively. In the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 through the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj through the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 through the third thin film transistor 5603c.

As described above, in the signal line driver circuit of FIG. 12, to which the timing chart of FIG. 14 is applied, the signal line can be precharged by providing the precharge period before the sub-selection periods. Thus, a video signal can be written to a pixel with high speed. Note that portions in FIG. 14 which are similar to those in FIG. 13 are denoted by the same reference numerals, and detailed description of the same portions or portions having similar functions is omitted.

Now, a constitution of the scan line driver circuit is described. The scan line driver circuit includes a shift register and a buffer. Also, the scan line driver circuit may include a level shifter in some cases. In the scan line driver circuit, when a clock signal (CLK) and a start pulse signal (SP) are input to the shift register, a selection signal is produced. The generated selection signal is buffered and amplified by the buffer, and the resulting signal is supplied to a corresponding scan line. Gate electrodes of transistors in pixels in one line are connected to the scan line. Further, since the transistors in the pixels in one line have to be turned on at the same time, a buffer which can feed a large amount of current is used.

An example of a shift register used as part of the scan line driver circuit is described with reference to FIG. 15 and FIG. 16.

Figure 15:
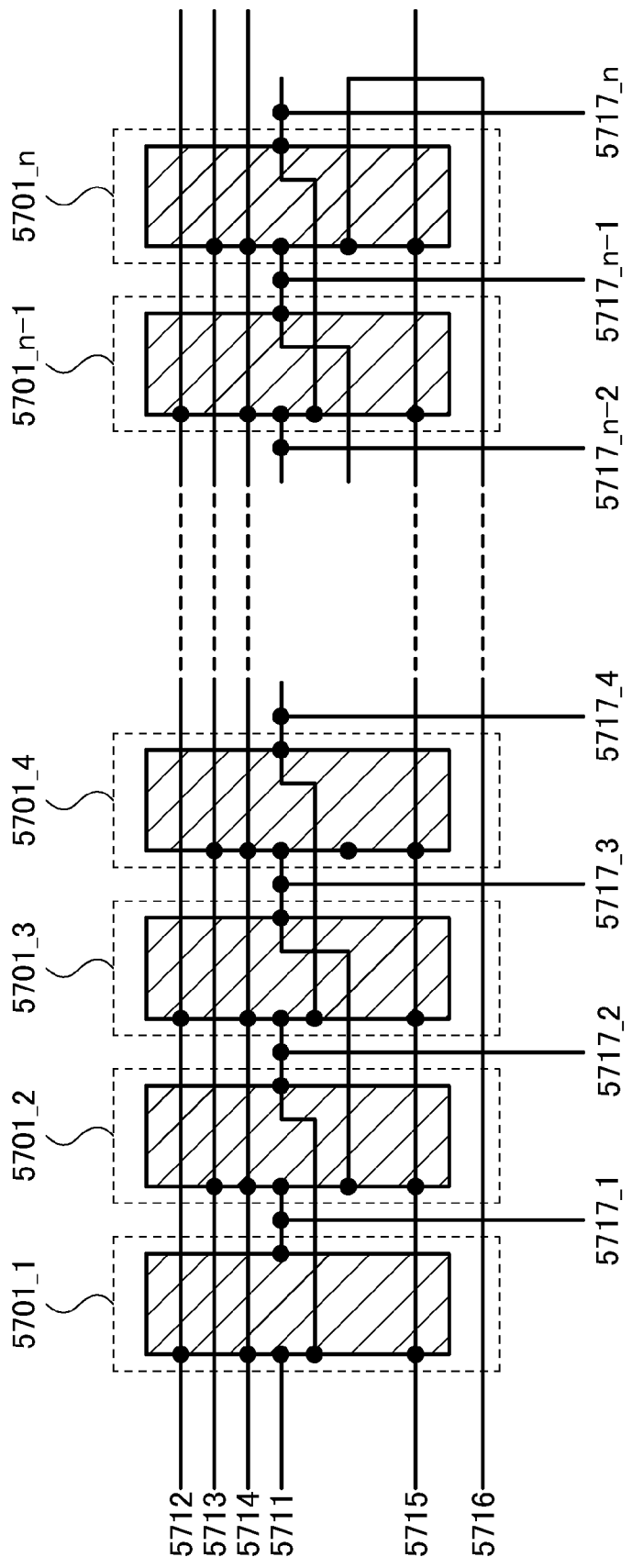
FIG. 15 is a diagram illustrating a structure of a shift register.

FIG. 15 illustrates a circuit configuration of the shift register. The shift register shown in FIG. 15 includes a plurality of flip-flops, flip-flops 5701_1 to 5701_n. Further, the shift register operates by input of a first clock signal, a second clock signal, a start pulse signal, and a reset signal.

Connection relationships of the shift register of FIG. 15 are described. In the flip-flop 5701_i (one of the flip-flops 5701_1 to 5701_n) of the i-th stage in the shift register of FIG. 15, a first wiring 5501 shown in FIG. 16 is connected to a seventh wiring 5717_i−1; a second wiring 5502 shown in FIG. 16 is connected to a seventh wiring 5717_i+1; a third wiring 5503 shown in FIG. 16 is connected to a seventh wiring 5717_i; and a sixth wiring 5506 shown in FIG. 16 is connected to a fifth wiring 5715.

Figure 16:
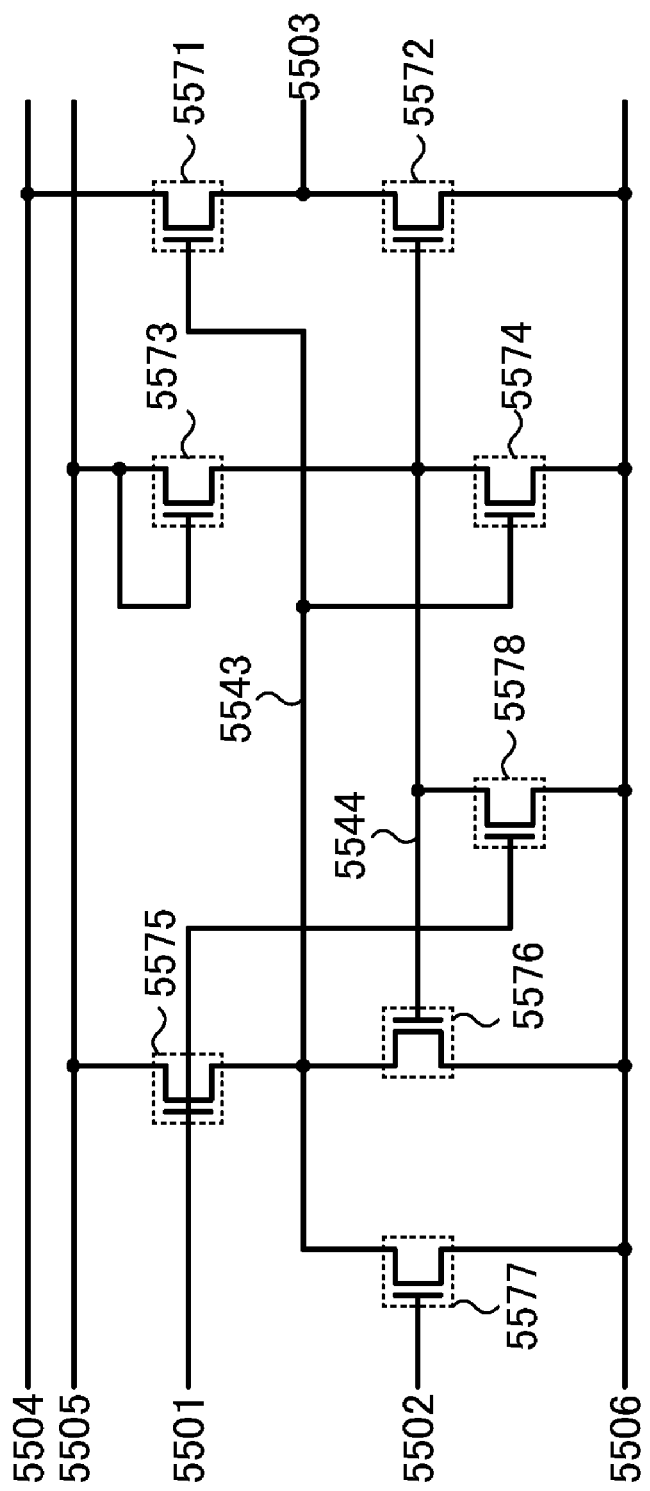
FIG. 16 illustrates a connection structure of a flip-flop of FIG. 14.

Further, a fourth wiring 5504 shown in FIG. 16 is connected to a second wiring 5712 in flip-flops of odd-numbered stages, and is connected to a third wiring 5713 in flip-flops of even-numbered stages. A fifth wiring 5505 shown in FIG. 16 is connected to a fourth wiring 5714.

Note that the first wiring 5501 shown in FIG. 16 of the flip-flop 5701_1 of a first stage is connected to a first wiring 5711, and the second wiring 5502 shown in FIG. 16 of the flip-flop 5701_n of an n-th stage is connected to a sixth wiring 5716.

The first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

FIG. 16 illustrates the detail of the flip-flop shown in FIG. 15. A flip-flop shown in FIG. 16 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 are n-channel transistors, and are turned on when the gate-source voltage ($V_{gs}$) exceeds the threshold voltage ($V_{th}$).

Now, a connection structure of the flip-flop shown in FIG. 16 is described below.

A first electrode (one of a source electrode or a drain electrode) of the first thin film transistor 5571 is connected to the fourth wiring 5504, and a second electrode (the other of the source electrode or the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, a second electrode of the third thin film transistor 5573 is connected to a gate electrode of the second thin film transistor 5572, and a gate electrode of the third thin film transistor 5573 is connected to the fifth wiring 5505.

A first electrode of the fourth thin film transistor 5574 is connected to the sixth wiring 5506, a second electrode of the fourth thin film transistor 5574 is connected to the gate electrode of the second thin film transistor 5572, and a gate electrode of the fourth thin film transistor 5574 is connected to a gate electrode of the first thin film transistor 5571.

A first electrode of the fifth thin film transistor 5575 is connected to the fifth wiring 5505, a second electrode of the fifth thin film transistor 5575 is connected to the gate electrode of the first thin film transistor 5571, and a gate electrode of the fifth thin film transistor 5575 is connected to the first wiring 5501.

A first electrode of the sixth thin film transistor 5576 is connected to the sixth wiring 5506, a second electrode of the sixth thin film transistor 5576 is connected to the gate electrode of the first thin film transistor 5571, and a gate electrode of the sixth thin film transistor 5576 is connected to the gate electrode of the second thin film transistor 5572.

A first electrode of the seventh thin film transistor 5577 is connected to the sixth wiring 5506, a second electrode of the seventh thin film transistor 5577 is connected to the gate electrode of the first thin film transistor 5571, and a gate electrode of the seventh thin film transistor 5577 is connected to the second wiring 5502. A first electrode of the eighth thin film transistor 5578 is connected to the sixth wiring 5506, a second electrode of the eighth thin film transistor 5578 is connected to the gate electrode of the second thin film transistor 5572, and a gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

The first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

Alternatively, the signal line driver circuit and the scan line driver circuit can be manufactured using only n-channel TFTs which can be manufactured by a method similar to the method for forming the non-linear element and together with the non-linear element described in Embodiment 2. Since the n-channel TFTs which can be formed by a method similar to the method for forming the non-linear element and together with the non-linear element described in Embodiment 2 have high mobility, the driving frequency of the driver circuits can be increased. For example, the scan line driver circuit including the n-channel TFTs which can be formed by a method similar to the method for forming the non-linear element and together with the non-linear element described in Embodiment 2 can operate at high speed; therefore, it is possible to increase the frame frequency or to achieve insertion of a black screen, for example.

In addition, when the channel width of the transistor in the scan line driver circuit is increased or a plurality of scan line driver circuits are provided, for example, higher frame frequency can be realized. When a plurality of scan line driver circuits is provided, a scan line driver circuit for driving even-numbered scan lines is provided on one side and a scan line driver circuit for driving odd-numbered scan lines is provided on the opposite side; thus, increase in frame frequency can be realized. Furthermore, the use of the plurality of scan line driver circuits for output of signals to the same scan line is advantageous in increasing the size of a display device.

In the case of manufacturing an active matrix light-emitting display device, which is an example of a semiconductor device to which an embodiment of the present invention is applied, a plurality of scan line driver circuits are preferably arranged because a plurality of thin film transistors are arranged in at least one pixel. An example of a block diagram of an active matrix light-emitting display device is illustrated in FIG. 11B.

Figure 11B:
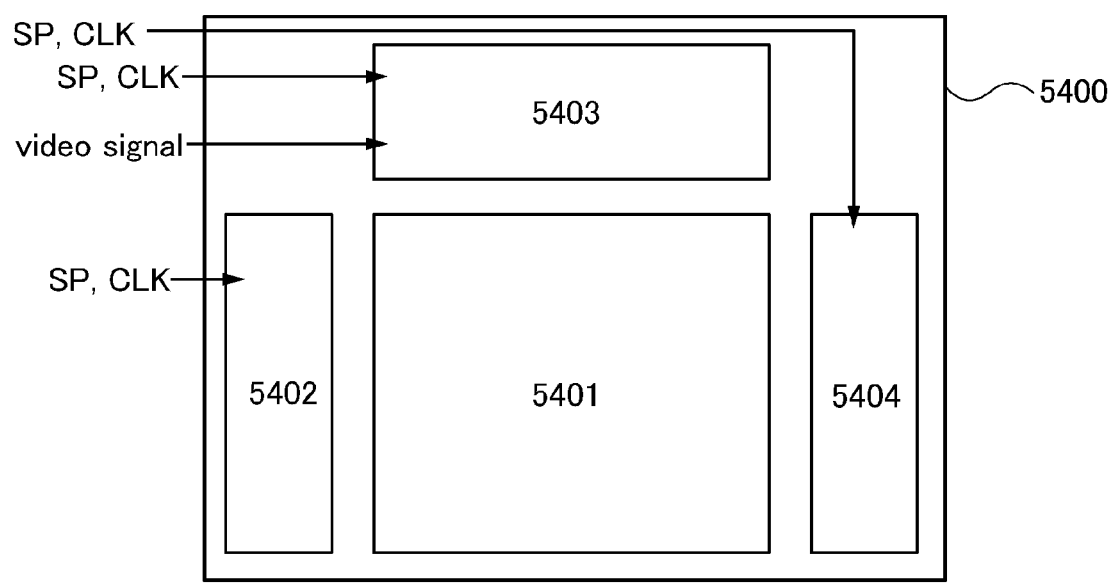

The light-emitting display device illustrated in FIG. 11B includes, over a substrate 5400, a pixel portion 5401 including a plurality of pixels each provided with a display element, a first scan line driver circuit 5402 and a second scan line driver circuit 5404 that select a pixel, and a signal line driver circuit 5403 that controls a video signal input to the selected pixel.

In the case of inputting a digital video signal to the pixel of the light-emitting display device of FIG. 11B, the pixel is put in a light-emitting state or non-light-emitting state by switching on/off of the transistor. Thus, grayscale can be displayed using an area ratio grayscale method or a time ratio grayscale method. An area ratio grayscale method refers to a driving method by which one pixel is divided into a plurality of subpixels and the respective subpixels are driven separately based on video signals so that grayscale is displayed. Further, a time ratio grayscale method refers to a driving method by which a period during which a pixel is in a light-emitting state is controlled so that grayscale is displayed.

Since the response time of light-emitting elements is shorter than that of liquid crystal elements or the like, the light-emitting elements are suitable for a time ratio grayscale method. Specifically, in the case of displaying by a time grayscale method, one frame period is divided into a plurality of subframe periods. Then, in accordance with video signals, the light-emitting element in the pixel is put in a light-emitting state or a non-light-emitting state in each subframe period. By dividing a frame into a plurality of subframes, the total length of time in which pixels actually emit light in one frame period can be controlled with video signals to display grayscales.

Note that in the light-emitting display device of FIG. 11B, in the case where one pixel includes two switching TFTs, a signal which is input to a first scan line which is a gate wiring of one of the switching TFTs is generated in the first scan line driver circuit 5402 and a signal which is input to a second scan line which is a gate wiring of the other switching TFT is generated in the second scan line driver circuit 5404. However, both of the signals which are input to the first scan line and the second scan line may be generated in one scan line driver circuit. In addition, for example, there is a possibility that a plurality scan lines used for controlling the operation of the switching elements be provided in each pixel depending on the number of switching TFTs included in one pixel. In this case, the signals which are input to the scan lines may all be generated in one scan line driver circuit or may be generated in a plurality of scan line driver circuits.

Also in the light-emitting display device, part of the driver circuit which can be formed using the n-channel TFTs can be provided over one substrate together with the thin film transistors of the pixel portion. Moreover, the signal line driver circuit and the scan line driver circuit can be manufactured using only the n-channel TFTs which can be formed by a method similar to the method for forming the non-linear element described in Embodiment 2.

The above driver circuit may be used for not only a liquid crystal display device or a light-emitting display device but also an electronic paper in which electronic ink is driven by utilizing an element electrically connected to a switching element. The electronic paper is also called an electrophoretic display device (electrophoretic display) and has advantages in that it has the same level of readability as regular paper, it has less power consumption than other display devices, and it can be made thin and lightweight.

There are a variety of modes of electrophoretic displays. The electrophoretic display is a device in which a plurality of microcapsules each including first particles having positive charge and second particles having negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a colorant, and does not move when there is not electric field. Also, a color of the first particles is different from a color of the second particles (the particles may also be colorless).

Thus, the electrophoretic display utilizes a so-called dielectrophoretic effect, in which a substance with high dielectric constant moves to a region with high electric field. The electrophoretic display does not require a polarizing plate and a counter substrate, which are necessary for a liquid crystal display device, so that the thickness and weight thereof are about half.

In electronic ink, the microcapsules are dispersed in a solvent, and this can be printed on a surface of glass, plastic, fabric, paper, or the like. Color display is also possible with the use of a color filter or particles including a coloring matter.

In addition, an active matrix display device can be completed by providing as appropriate, a plurality of the microcapsules over an active matrix substrate so as to be interposed between two electrodes, and can perform display by application of electric field to the microcapsules. For example, the active matrix substrate obtained using the thin film transistors which can be formed by a method similar to the method for forming the non-linear element described in Embodiment 2 can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material thereof.

In accordance with the above steps, a display device which has high reliability and is mounted with a protective circuit with stabilized operation and small occupied area can be manufactured.

This embodiment can be implemented in combination with a structure described in another embodiment as appropriate.

Embodiment 5

A thin film transistor can be manufactured together with a non-linear element according to an embodiment of the present invention, and the thin film transistor can be used for a pixel portion and further for a driver circuit, so that a semiconductor device having a display function (also called a display device) can be manufactured. Moreover, a thin film transistor and a non-linear element according to an embodiment of the present invention can be used for part of a driver circuit or an entire driver circuit formed over one substrate together with a pixel portion, so that a system-on-panel can be formed.

The display device includes a display element. As the display element, a liquid crystal element (also referred to as a liquid crystal display element) or a light-emitting element (also referred to as a light-emitting display element) can be used. A light-emitting element includes, in its category, an element whose luminance is controlled by current or voltage, and specifically includes an inorganic electroluminescent (EL) element, an organic EL element, and the like. Further, a display medium whose contrast is changed by an electric effect, such as electronic ink, can be used.

In addition, the display device includes a panel in which a display element is sealed, and a module in which an IC and the like including a controller are mounted on the panel. An embodiment of the present invention further relates to one mode of an element substrate before the display element is completed in a process for manufacturing the display device, and the element substrate is provided with a plurality of pixels each having a means for supplying current to the display element. Specifically, the element substrate may be in a state after only a pixel electrode of the display element is formed, a state after a conductive film to be a pixel electrode is formed but before the conductive film is etched to be the pixel electrode, or any other states.

A display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module in which an integrated circuit (IC) is directly mounted on a display element by a chip-on-glass (COG) method.

The appearance and a cross section of a liquid crystal display panel which is one mode of a display device according to an embodiment of the present invention will be described in this embodiment with reference to FIGS. 17A-C. FIGS. 17A and 17B are top views of panels in which thin film transistors 4010 and 4011 and a liquid crystal element 4013 which are formed over a first substrate 4001 are sealed with a sealant 4005 between the first substrate 4001 and a second substrate 4006. The thin film transistors 4010 and 4011 can be formed similarly to the non-linear element and each include a semiconductor layer including a semiconductor oxide containing In, Ga, and Zn and have excellent electrical characteristics. FIG. 17C is a cross-sectional view taken along M-N of FIGS. 17A and 17B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed with the sealant 4005 between the first substrate 4001 and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on a connection method of the driver circuit which is separately formed, and a COG method, a wire bonding method, a TAB method, or the like can be used. FIG. 17A illustrates an example in which the signal line driver circuit 4003 is mounted by a COG method and FIG. 17B illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 17C illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

Each of the thin film transistors 4010 and 4011 has excellent electrical characteristics and includes a semiconductor layer including a semiconductor oxide containing In, Ga, and Zn. Additionally, the thin film transistors 4010 and 4011 can be formed by a method similar to the method for forming the non-linear element and together with the non-linear element described in Embodiment 2. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 serving as alignment films, respectively, and hold the liquid crystal layer 4008 with the insulating layers 4032 and 4033 interposed therebetween.

Note that the first substrate 4001 and the second substrate 4006 can be formed from glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance (a cell gap) between the pixel electrode layer 4030 and the counter electrode layer 4031. Alternatively, a spherical spacer may be used.

Alternatively, a blue phase liquid crystal for which an alignment film is unnecessary may be used. A blue phase is a type of liquid crystal phase, which appears just before a cholesteric liquid crystal changes into an isotropic phase when the temperature of the cholesteric liquid crystal is increased. A blue phase appears only within a narrow temperature range; therefore, the liquid crystal layer 4008 is formed using a liquid crystal composition containing a chiral agent at 5 wt. % or more in order to expand the temperature range. The liquid crystal composition including a blue phase liquid crystal and a chiral agent has a short response time of 10 μs to 100 μs, and is optically isotropic; therefore, alignment treatment is not necessary and viewing angle dependence is small.

Note that this embodiment describes an example of a transmissive liquid crystal display device; however, an embodiment of the present invention can be applied to a reflective liquid crystal display device or a transflective liquid crystal display device.

Although a liquid crystal display device of this embodiment has a polarizing plate provided outer than the substrate (the viewer side) and a coloring layer and an electrode layer of a display element provided inner than the substrate, which are arranged in that order, the polarizing plate may be inner than the substrate. The stacked structure of the polarizing plate and the coloring layer is not limited to that shown in this embodiment and may be set as appropriate in accordance with the materials of the polarizing plate and the coloring layer and the condition of the manufacturing process. Further, a light-blocking film serving as a black matrix may be provided.

In this embodiment, in order to reduce the unevenness of the surface of the thin film transistors and to improve the reliability of the thin film transistors, the non-linear element described in Embodiment 2 and the thin film transistors which can be formed by a method similar to the method for forming the non-linear element and can be formed together with the non-linear element are covered with protective films or insulating layers (the insulating layers 4020 and 4021) serving as planarizing insulating films. Note that the protective film is provided to prevent entry of impurities floating in air, such as an organic substance, a metal substance, or moisture, and is preferably a dense film. The protective film may be formed by a sputtering method using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although the protective film is formed by a sputtering method in this embodiment, the method is not limited to a particular method and may be selected from a variety of methods.

Here, the insulating layer 4020 is formed to have a stacked structure as the protective film. Here, a silicon oxide film is formed by a sputtering method as a first layer of the insulating layer 4020. The use of a silicon oxide film for the protective film provides an advantageous effect of preventing hillock of an aluminum film used for a source electrode layer and a drain electrode layer.

Moreover, an insulating layer is formed as a second layer of the protective film. Here, a silicon nitride film is formed by a sputtering method as a second layer of the insulating layer 4020. When a silicon nitride film is used for the protective film, it is possible to prevent movable ions such as sodium from entering a semiconductor region to change the electrical characteristics of the TFT.

Further, after the protective film is formed, the oxide semiconductor layer may be annealed (at 300° C. to 400° C.).

Further, the insulating layer 4021 is formed as the planarizing insulating film. The insulating layer 4021 can be formed from an organic material having heat resistance, such as polyimide, acrylic, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. A siloxane-based resin may include as a substituent at least one of fluorine, an alkyl group, and an aryl group, as well as hydrogen. Note that the insulating layer 4021 may be formed by stacking a plurality of insulating films formed from these materials.

Note that a siloxane-based resin is a resin formed from a siloxane-based material as a starting material and having the bond of Si—O—Si. The siloxane-based resin may include as a substituent at least one of fluorine, an alkyl group, and aromatic hydrocarbon, as well as hydrogen.

The method for the formation of the insulating layer 4021 is not limited to a particular method and the following method can be used depending on the material of the insulating layer 4021: a sputtering method, an SOG method, spin coating, dip coating, spray coating, a droplet discharge method (e.g., an inkjet method, screen printing, or offset printing), a doctor knife, a roll coater, a curtain coater, a knife coater, or the like. In the case of forming the insulating layer 4021 with the use of a material solution, annealing (at 300° C. to 400° C.) may be performed on an oxide semiconductor layer at the same time as a baking step. When the baking step of the insulating layer 4021 and the annealing of the oxide semiconductor layer are combined, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed of the conductive composition has preferably a sheet resistance of 10000 Ω/square or less and a transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. As examples thereof, polyaniline or a derivative thereof, polypyrrole or a derivative thereof, polythiophene or a derivative thereof, a copolymer of two or more of them can be given.

Further, a variety of signals and potentials are supplied from an FPC 4018 to the signal line driver circuit 4003 which is formed separately, the scan line driver circuit 4004, and the pixel portion 4002.

In this embodiment, a connecting terminal electrode 4015 is formed using the same conductive film as the pixel electrode layer 4030 included in the liquid crystal element 4013, and a terminal electrode 4016 is formed using the same conductive film as the source and drain electrode layers of the thin film transistors 4010 and 4011.

The connecting terminal electrode 4015 is electrically connected to a terminal of the FPC 4018 through an anisotropic conductive film 4019.

Although FIGS. 17A-C show an example in which the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

Figure 18:
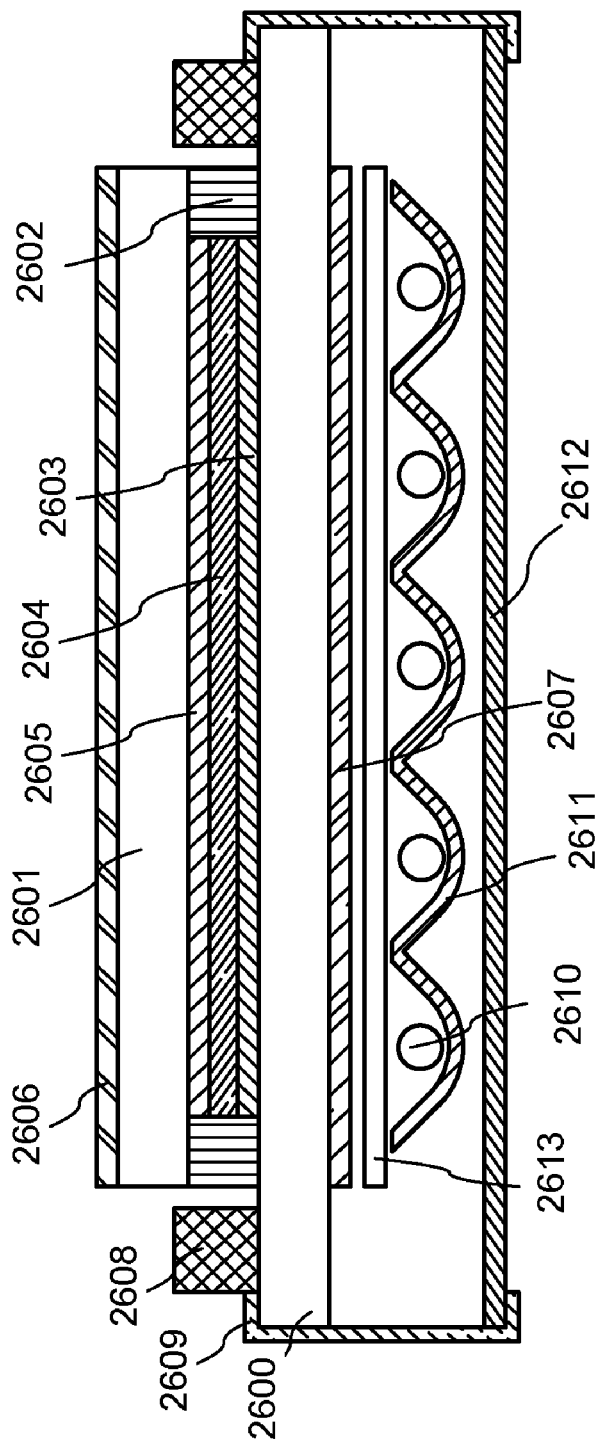
FIG. 18 is a cross-sectional view illustrating a semiconductor device of an embodiment of the present invention.

FIG. 18 illustrates an example in which a liquid crystal display module is formed as a semiconductor device using a TFT substrate 2600 manufactured according to an embodiment of the present invention.

FIG. 18 illustrates an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the case of the RGB system, coloring layers corresponding to colors of red, green, and blue are provided for pixels. Polarizing plates 2606 and 2607 and a diffuser plate 2613 are provided outside the TFT substrate 2600 and the counter substrate 2601. A light source includes a cold cathode tube 2610 and a reflective plate 2611, and a circuit board 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be employed.

In accordance with the above steps, a liquid crystal panel which has high reliability and is mounted with a protective circuit with stabilized operation and small occupied area can be manufactured.

This embodiment can be implemented in combination with a structure described in another embodiment as appropriate.

Embodiment 6

According to an embodiment of the present invention, a thin film transistor can be manufactured together with a non-linear element and the thin film transistor can be used for a pixel portion and further for a driver circuit, so that a semiconductor device having a display function (also called a display device) can be manufactured.

This embodiment describes an example of a light-emitting display device as a display device according to an embodiment of the present invention. As an example of a display element of the display device, here, a light-emitting element utilizing electroluminescence is described. Light-emitting elements utilizing electroluminescence are classified according to whether a light emitting material is an organic compound or an inorganic compound. In general, the former is referred to as an organic EL element and the latter is referred to as an inorganic EL element.

In an organic EL element, by application of a voltage to a light-emitting element, electrons and holes are separately injected from a pair of electrodes into a layer containing a light-emitting organic compound, and thus current flows. Then, those carriers (i.e., electrons and holes) are recombined, and thus, the light-emitting organic compound is excited. When the light-emitting organic compound returns to a ground state from the excited state, light is emitted. Owing to such a mechanism, this light emitting element is referred to as a current-excitation light emitting element.

The inorganic EL elements are classified according to their element structures into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that an organic EL element is used as a light-emitting element in this example.

Figure 19:
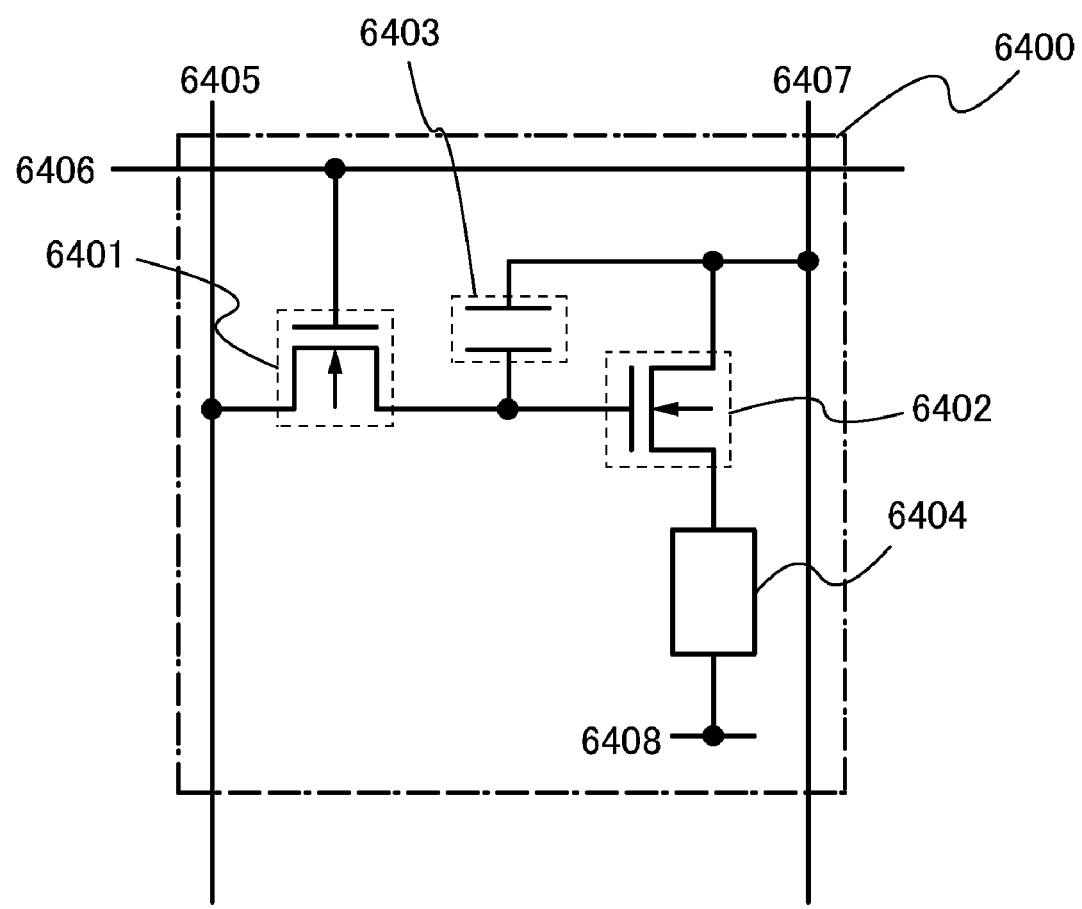
FIG. 19 illustrates an equivalent circuit of a pixel in a semiconductor device of an embodiment of the present invention.

FIG. 19 illustrates an example of a pixel structure to which digital time grayscale driving can be applied, as an example of a semiconductor device to which an embodiment of the present invention is applied.

A structure and operation of a pixel to which digital time grayscale driving can be applied are described. In this example, one pixel includes two n-channel transistors in each of which a channel formation region includes an oxide semiconductor layer and which can be formed by a method similar to the method for forming the non-linear element and can be formed together with the non-linear element described in Embodiment 2.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408.

The second electrode (common electrode 6408) of the light-emitting element 6404 is set to a low power supply potential. The low power supply potential is a potential smaller than a high power supply potential when the high power supply potential set to the power supply line 6407 is a reference. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. In order to make the light-emitting element 6404 emit light, potentials are set so that the potential difference between the high power supply potential and the low power supply potential is greater than or equal to the forward threshold voltage of the light-emitting element 6404.

Gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is either substantially turned on or substantially turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to the sum of the voltage of the power supply line and the Vth of the driver transistor 6402 is applied to the signal line 6405.

In the case of performing analog grayscale driving instead of digital time grayscale driving, the same pixel structure as that in FIG. 19 can be used by changing signal input.

In the case of performing analog grayscale driving, a voltage higher than or equal to the sum of the forward voltage of the light-emitting element 6404 and the Vth of the driver transistor 6402 is applied to the gate of the driver transistor 6402. The forward voltage of the light-emitting element 6404 indicates a voltage at which a desired luminance is obtained, and include at least a forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure shown in FIG. 19 is not limited thereto. For example, a switch, a resistor, a capacitor, a transistor, a logic circuit, or the like may be added to the pixel shown in FIG. 19.

Figure 20A:
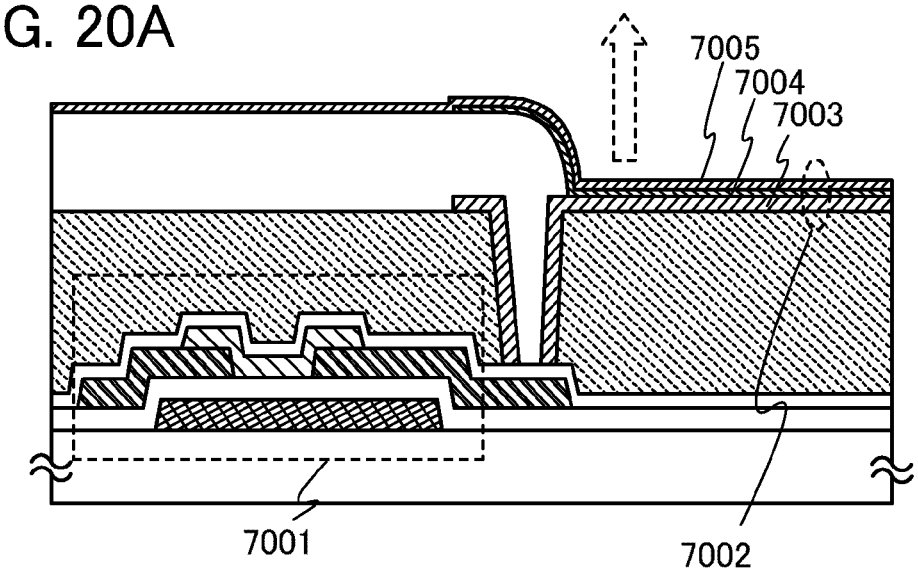
FIGS. 20A to 20C each illustrate a semiconductor device of an embodiment of the present invention.
Figure 20B:
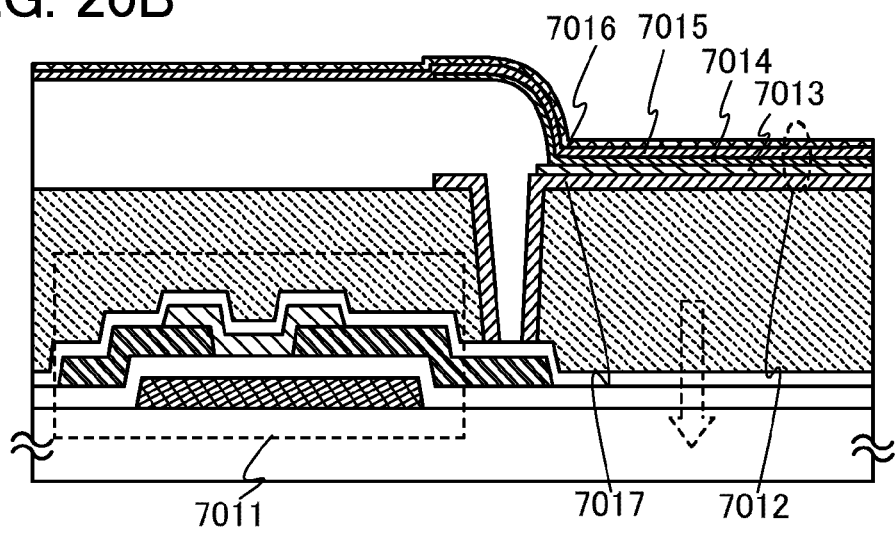
Figure 20C:
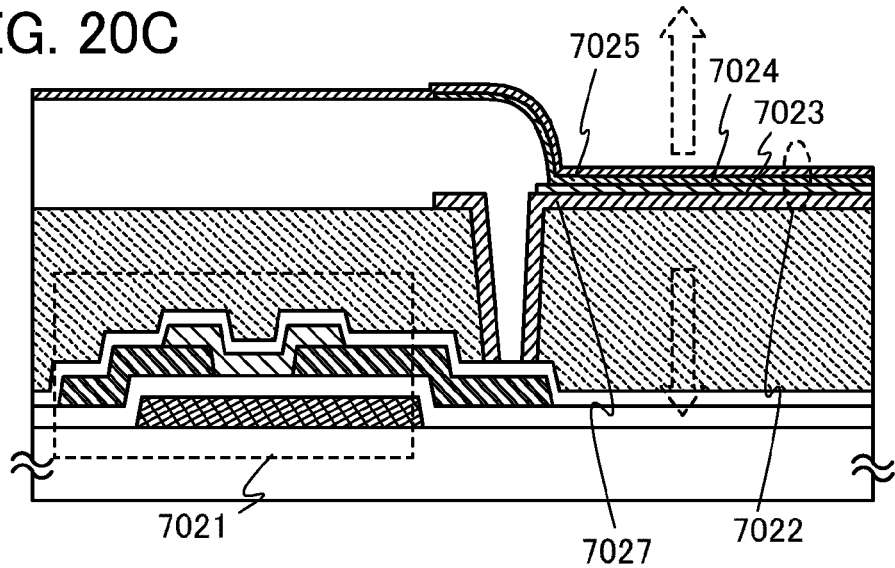

Next, structures of a light-emitting element are described with reference to FIGS. 20A to 20C. A cross-sectional structure of a pixel is described here by taking an n-channel driver TFT as an example. TFTs 7001, 7011, and 7021 serving as driver TFTs used for a semiconductor device, which are illustrated in FIGS. 20A, 20B, and 20C, can be formed by a method similar to the method for forming the non-linear element and together with the non-linear element described in Embodiment 2. The TFTs 7001, 7011, and 7021 have excellent electrical characteristics and each include a semiconductor layer including a semiconductor oxide containing In, Ga, and Zn.

In addition, in order to extract light emitted from the light-emitting element, at least one of an anode and a cathode is required to transmit light. A thin film transistor and a light-emitting element are formed over a substrate. A light-emitting element can have a top-emission structure in which light is extracted through the surface opposite to the substrate; a bottom-emission structure in which light is extracted through the surface on the substrate side; or a dual-emission structure in which light is extracted through the surface opposite to the substrate and the surface on the substrate side. The pixel structure according to an embodiment of the present invention can be applied to a light-emitting element having any of these emission structures.

A light-emitting element with a top-emission structure is described with reference to FIG. 20A.

FIG. 20A is a cross-sectional view of a pixel in a case where the TFT 7001 serving as a driver TFT is an n-channel TFT and light generated in a light-emitting element 7002 is emitted to an anode 7005 side. In FIG. 20A, a cathode 7003 of the light-emitting element 7002 is electrically connected to the TFT 7001 serving as a driver TFT, and a light-emitting layer 7004 and the anode 7005 are stacked in this order over the cathode 7003. The cathode 7003 can be formed using any of conductive materials which have a low work function and reflect light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film formed from a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 20A, light is emitted from the light-emitting element 7002 to the anode 7005 side as indicated by an arrow.

Next, a light-emitting element having a bottom-emission structure is described with reference to FIG. 20B. FIG. 20B is a cross-sectional view of a pixel in the case where a driver TFT 7011 is an n-channel TFT, and light is emitted from a light-emitting element 7012 to a cathode 7013 side. In FIG. 20B, the cathode 7013 of the light-emitting element 7012 is formed over a light-transmitting conductive film 7017 which is electrically connected to the driver TFT 7011, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property. For the cathode 7013, any of conductive materials which have a low work function can be used as in the case of FIG. 20A. Note that the cathode 7013 is formed to have a thickness with which the cathode 7013 can transmit light (preferably, approximately from 5 nm to 30 nm). For example, an aluminum film with a thickness of 20 nm can be used as the cathode 7013. The light-emitting layer 7014 may be formed of a single layer or by stacking a plurality of layers as in the case of FIG. 20A. The anode 7015 is not required to transmit light, but can be formed using a light-transmitting conductive material as in the case of FIG. 20A. For the light-blocking film 7016, metal or the like that reflects light can be used; however, it is not limited to a metal film. For example, a resin or the like to which black pigment is added can be used.

The light-emitting element 7012 corresponds to a region where the cathode 7013 and the anode 7015 sandwich the light-emitting layer 7014. In the case of the pixel illustrated in FIG. 20B, light is emitted from the light-emitting element 7012 to the cathode 7013 side as indicated by an arrow.

Next, a light-emitting element having a dual-emission structure is described with reference to FIG. 20C. In FIG. 20C, a cathode 7023 of a light-emitting element 7022 is formed over a light-transmitting conductive film 7027 which is electrically connected to the driver TFT 7021, and a light-emitting layer 7024 and an anode 7025 are stacked in this order over the cathode 7023. As in the case of FIG. 20A, the cathode 7023 can be formed of any of conductive materials which have a low work function. Note that the cathode 7023 is formed to have a thickness with which the cathode 7023 can transmit light. For example, an Al film having a thickness of 20 nm can be used as the cathode 7023. The light-emitting layer 7024 may be formed using a single layer or by stacking a plurality of layers as in the case of FIG. 20A. In a manner similar to FIG. 20A, the anode 7025 can be formed using a light-transmitting conductive material.

The light-emitting element 7022 corresponds to a region where the cathode 7023, the light-emitting layer 7024, and the anode 7025 overlap with each other. In the pixel illustrated in FIG. 20C, light is emitted from the light-emitting element 7022 to both the anode 7025 side and the cathode 7023 side as indicated by arrows.

Although an organic EL element is described here as a light-emitting element, an inorganic EL element can be alternatively provided as a light-emitting element.

Note that this embodiment describes the example in which a thin film transistor (driver TFT) which controls the driving of a light-emitting element is electrically connected to the light-emitting element, but a structure may be employed in which a current control TFT is connected between the driver TFT and the light-emitting element.

The semiconductor device described in this embodiment is not limited to the structures illustrated in FIGS. 20A to 20C, and can be modified in various ways based on the spirit of techniques of an embodiment of the present invention.

Figure 21A:
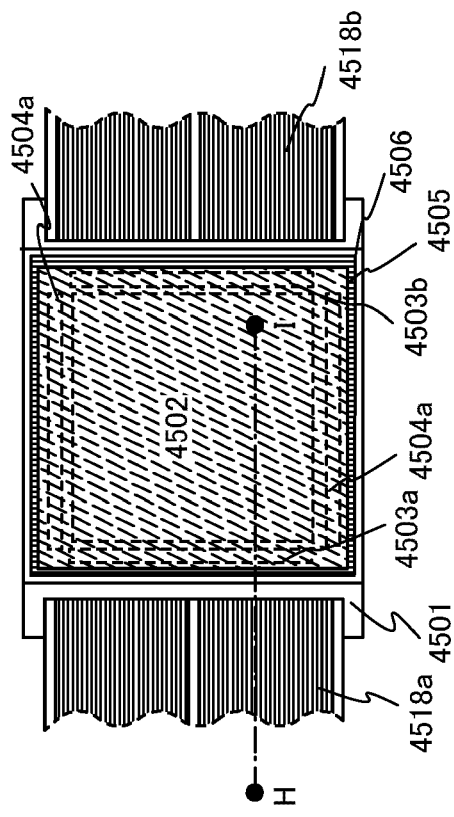
FIG. 21A is a top view and FIG. 21B is a cross-sectional view illustrating a semiconductor device of an embodiment of the present invention.
Figure 21B:
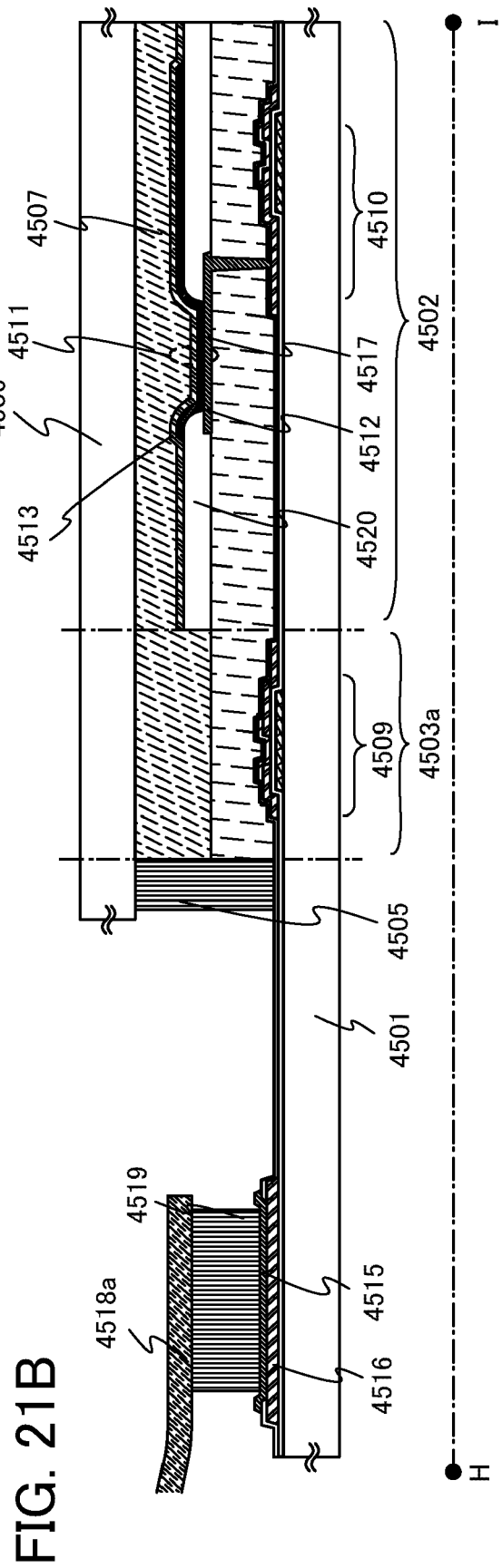

Next, the appearance and cross section of a light-emitting display panel (also referred to as a light-emitting panel) which is one mode of the present invention will be described with reference to FIGS. 21A and 21B. FIG. 21A is a top view of a panel in which a light-emitting element and a thin film transistor are sealed with a sealant between a first substrate and a second substrate. The thin film transistor includes, a semiconductor layer including a semiconductor oxide containing In, Ga, and Zn, and thus has excellent electrical characteristics, as the non-linear element. FIG. 21B is a cross-sectional view along H-I of FIG. 21A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is formed over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed, together with filler 4507, with the first substrate 4501, the sealant 4505, and the second substrate 4506. In this manner, it is preferable that the light-emitting display panel be packaged (sealed) with a protective film (such as an attachment film or an ultraviolet curable resin film) or a cover material with high air-tightness and little degasification so as not to be exposed to external air.

The pixel portion 4502, the signal line driver circuits 4503a and 4503b, and the scan line driver circuits 4504a and 4504b formed over the first substrate 4501 each include a plurality of thin film transistors. A thin film transistor 4510 included in the pixel portion 4502 and the thin film transistor 4509 included in the signal line driver circuit 4503a are illustrated as an example in FIG. 21B.

Each of the thin film transistors 4509 and 4510 has excellent electrical characteristics and includes a semiconductor layer including a semiconductor oxide containing In, Ga, and Zn. Thin film transistors which can be formed by a method similar to the method for forming the non-linear element and together with the non-linear element described in Embodiment 2 can be used as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited thereto. The structure of the light-emitting element 4511 can be changed as appropriate depending on a direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening portion on the first electrode layer 4517 so that a sidewall of the opening portion is formed as an inclined surface with a continuous curvature.

The electroluminescent layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

In this embodiment, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connecting terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

In addition, if needed, an optical film such as a polarizing plate, a circularly polarizing plate (including an elliptically polarizing plate), a retardation plate (a quarter-wave plate or a half-wave plate), and a color filter may be provided as appropriate on an emission surface of the light-emitting element. Further, the polarizing plate or the circularly polarizing plate may be provided with an anti-reflection film. For example, anti-glare treatment can be performed by which reflected light is diffused by depressions and projections of the surface and glare can be reduced.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. In addition, only the signal line driver circuits or only part thereof, or only the scan line driver circuits or only part thereof may be separately formed and then mounted. This embodiment is not limited to the structure shown in FIGS. 21A and 21B.

In accordance with the above steps, a light-emitting display device (display panel) which has high reliability and is mounted with a protective circuit with stabilized operation and small occupied area can be manufactured.

This embodiment can be implemented in combination with a structure described in another embodiment as appropriate.

Embodiment 7

A display device according to an embodiment of the present invention can be applied as an electronic paper. An electronic paper can be used for electronic appliances of a variety of fields for displaying information. For example, an electronic paper can be used for electronic book reader (an e-book reader), posters, advertisement in vehicles such as trains, displays of various cards such as credit cards, and the like. Examples of such electronic appliances are illustrated in FIGS. 22A and 22B and FIG. 23.

Figure 22A:
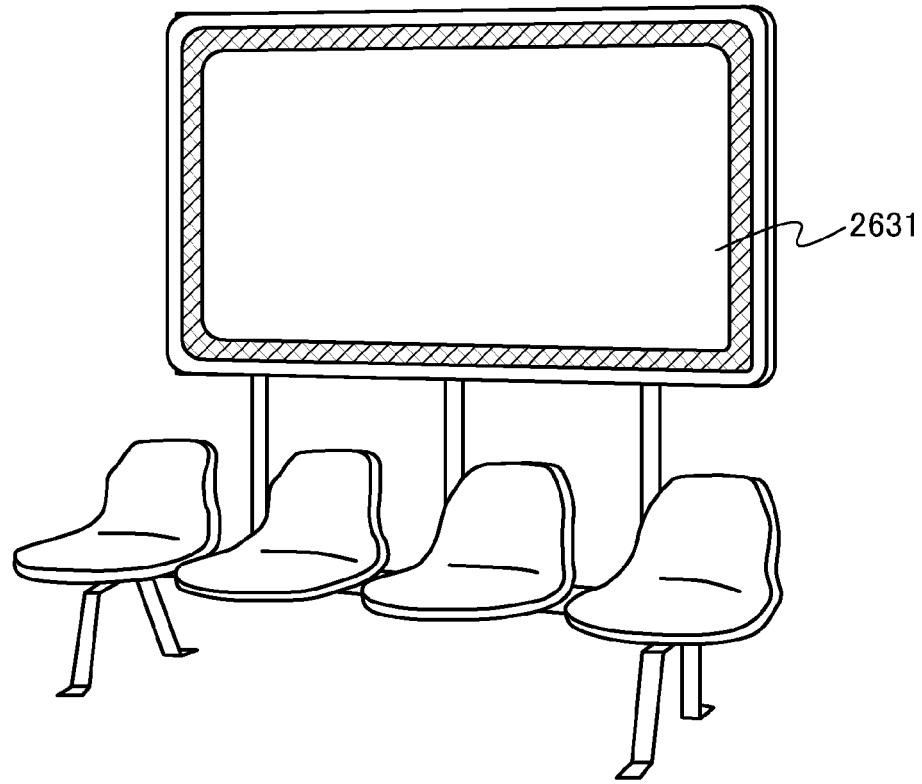
FIGS. 22A and 22B illustrate examples of applications of an electronic paper.

FIG. 22A illustrates a poster 2631 formed using an electronic paper. If the advertising medium is printed paper, the advertisement is replaced by hands; however, when an electronic paper to which an embodiment of the present invention is applied is used, the advertisement display can be changed in a short time. Moreover, a stable image can be obtained without defects. Further, the poster may send and receive information wirelessly.

Figure 22B:
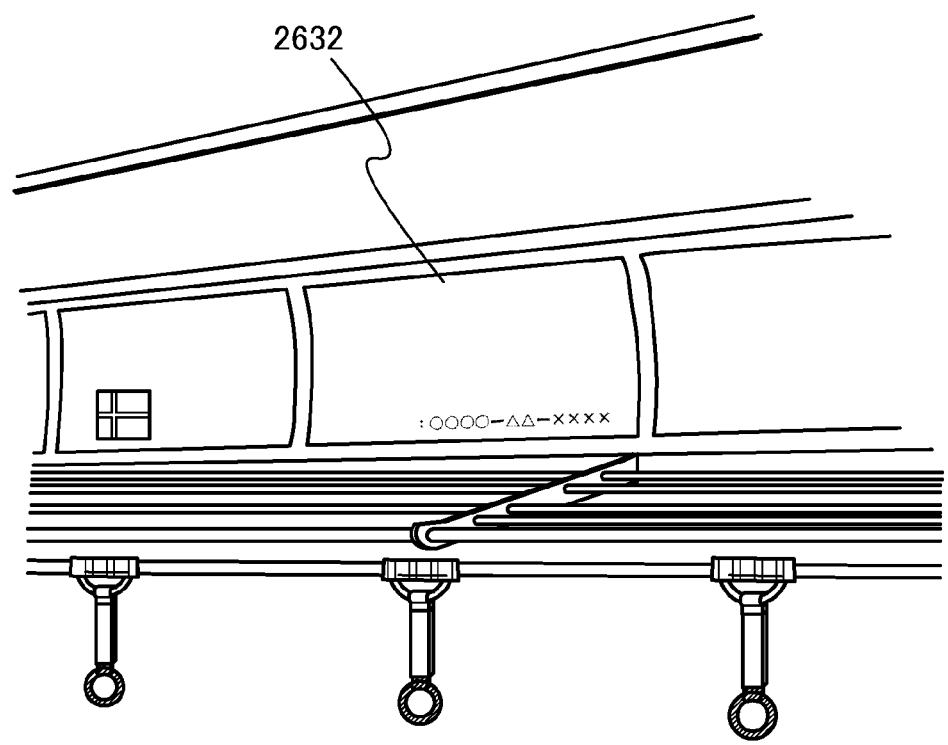

FIG. 22B illustrates an advertisement 2632 in a vehicle such as a train. If the advertising medium is printed paper, the advertisement is replaced by hands; however, when an electronic paper to which an embodiment of the present invention is applied is used, the advertisement display can be changed in a short time without much manpower. Moreover, a stable image can be obtained without defects. Further, the advertisement in vehicles may send and receive information wirelessly.

Figure 23:
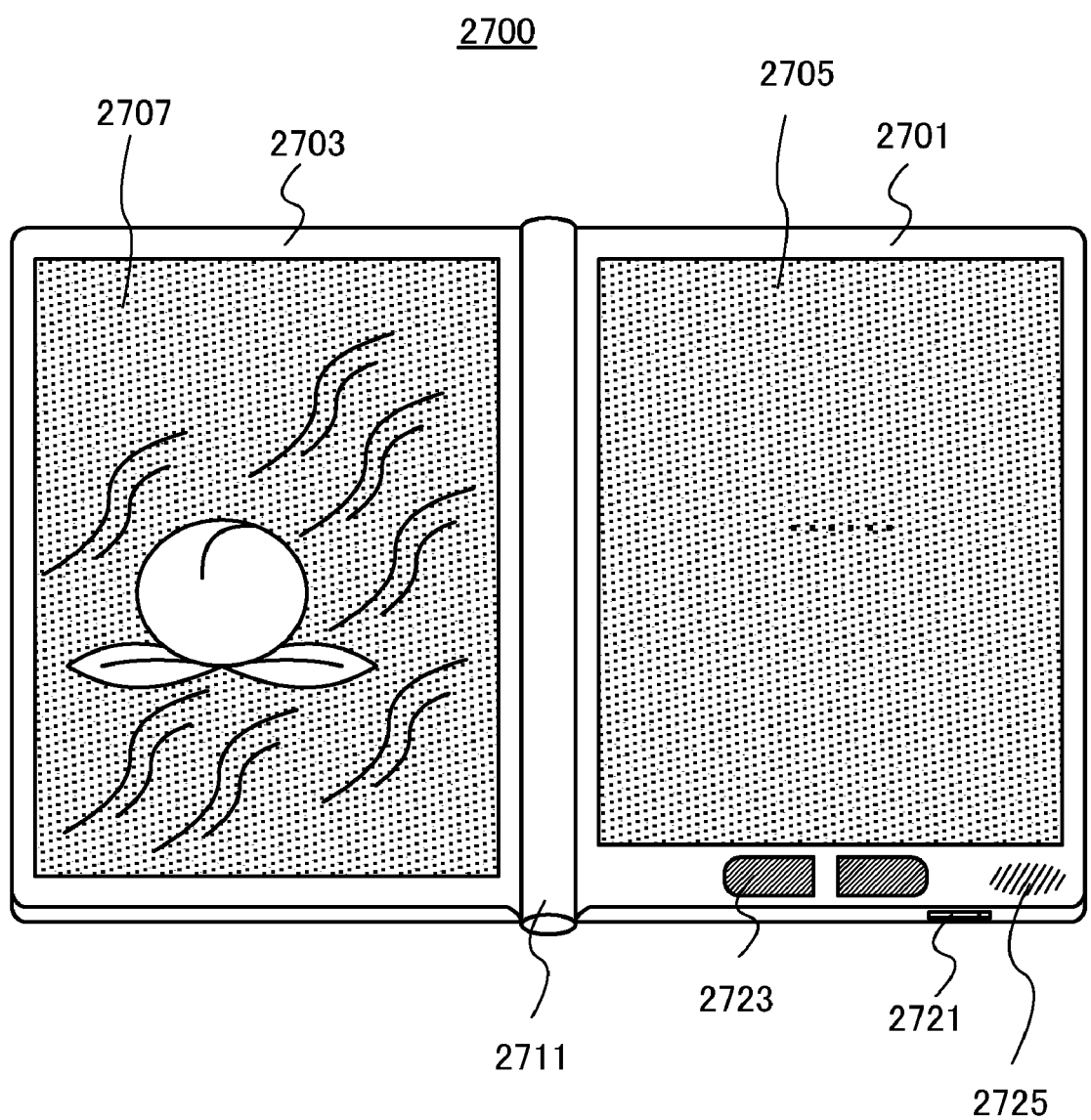
FIG. 23 is an external view illustrating an example of an electronic book reader.

FIG. 23 illustrates an example of an electronic book reader 2700. For example, the electronic book reader 2700 includes two housings 2701 and 2703. The housings 2701 and 2703 are bonded with a hinge 2711 so that the electronic book reader 2700 can be opened and closed along the hinge 2711. With such a structure, the electronic book reader 2700 can be handled like a paper book.

A display portion 2705 is incorporated in the housing 2701 and a display portion 2707 is incorporated in the housing 2703. The display portion 2705 and the display portion 2707 may display one image, or may display different images. In the structure where different images are displayed on the display portion 2705 and the display portion 2707, for example, the right display portion (the display portion 2705 in FIG. 23) can display text and the left display portion (the display portion 2707 in FIG. 23) can display images.

FIG. 23 illustrates an example in which the housing 2701 is provided with an operation portion and the like. For example, the housing 2701 is provided with a power supply switch 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adopter or a USB cable, and the like), a storage medium inserting portion, or the like. Moreover, the electronic book reader 2700 may have a function of an electronic dictionary.

Further, the electronic book reader 2700 may send and receive information wirelessly. Desired book data or the like can be purchased and downloaded from an electronic book server wirelessly.

In accordance with the above steps, an electronic appliance which has high reliability and is mounted with a protective circuit with stabilized operation and small occupied area can be manufactured.

This embodiment can be implemented in combination with a structure described in another embodiment as appropriate.

Embodiment 8

A semiconductor device according to an embodiment of the present invention can be applied to a variety of electronic appliances (including game machines). As the electronic appliances, for example, there are a television device (also called a television or a television receiver), a monitor for a computer or the like, a camera such as a digital camera or a digital video camera, a digital photo frame, a cellular phone (also called a mobile phone or a mobile telephone device), a portable game console, a portable information terminal, an audio playback device, and a large game machine such as a pachinko machine.

Figure 24A:
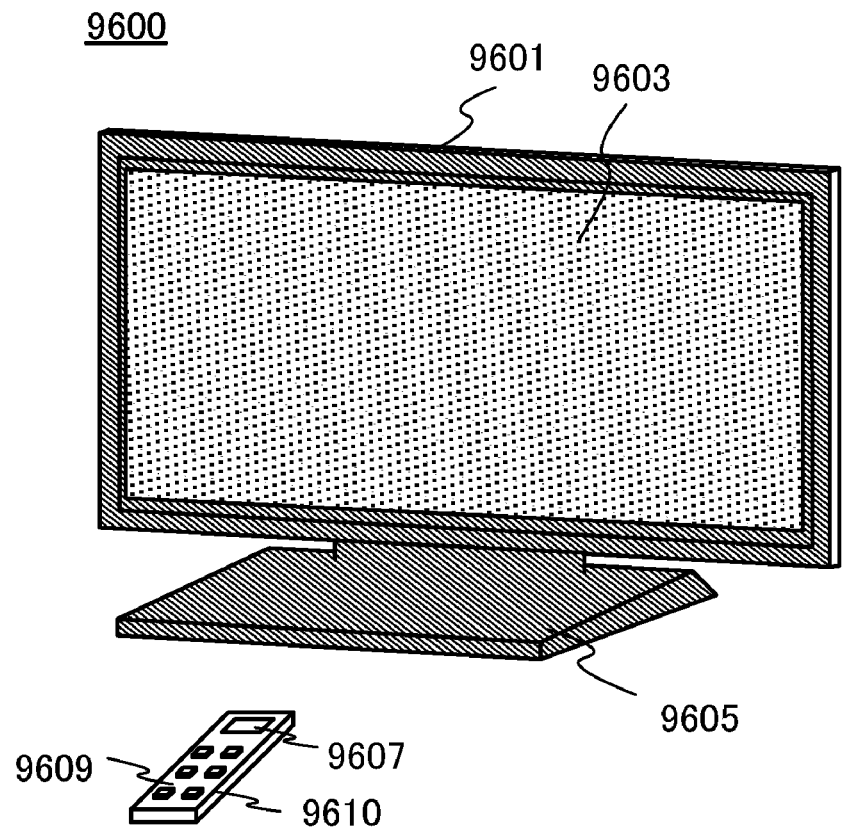
FIG. 24A is an external view of an example of a television device and FIG. 24B is an external view of an example of a digital photo frame.

FIG. 24A illustrates an example of a television device 9600. A display portion 9603 is incorporated in a housing 9601 of the television device 9600. The display portion 9603 can display images. Here, the housing 9601 is supported on a stand 9605.

The television device 9600 can be operated by an operation switch of the housing 9601 or a separate remote controller 9610. The channel and volume can be controlled with operation keys 9609 of the remote controller 9610 and the images displayed on the display portion 9603 can be controlled. Moreover, the remote controller 9610 may have a display portion 9607 on which the information outgoing from the remote controller 9610 is displayed.

Note that the television device 9600 is provided with a receiver, a modem, and the like. With the receiver, general television broadcasting can be received. Moreover, when the display device is connected to a communication network with or without wires via the modem, one-way (from a sender to a receiver) or two-way (e.g., between a sender and a receiver or between receivers) information communication can be performed.

Figure 24B:
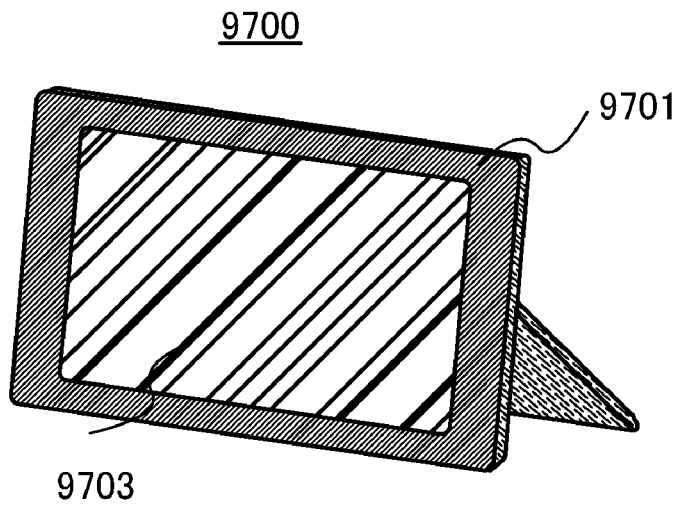

FIG. 24B illustrates an example of a digital photo frame 9700. For example, a display portion 9703 is incorporated in a housing 9701 of the digital photo frame 9700. The display portion 9703 can display a variety of images, for example, displays image data taken with a digital camera or the like, so that the digital photo frame can function in a manner similar to a general picture frame.

Note that the digital photo frame 9700 is provided with an operation portion, an external connection terminal (such as a USB terminal or a terminal which can be connected to a variety of cables including a USB cable), a storage medium inserting portion, and the like. They may be incorporated on the same plane as the display portion; however, they are preferably provided on a side surface or the rear surface of the display portion because the design is improved. For example, a memory including image data taken with a digital camera is inserted into the storage medium inserting portion of the digital photo frame and the image data is imported. Then, the imported image data can be displayed on the display portion 9703.

The digital photo frame 9700 may send and receive information wirelessly. Via wireless communication, desired image data can be wirelessly imported into the digital photo frame 9700 and displayed.

Figure 25A:
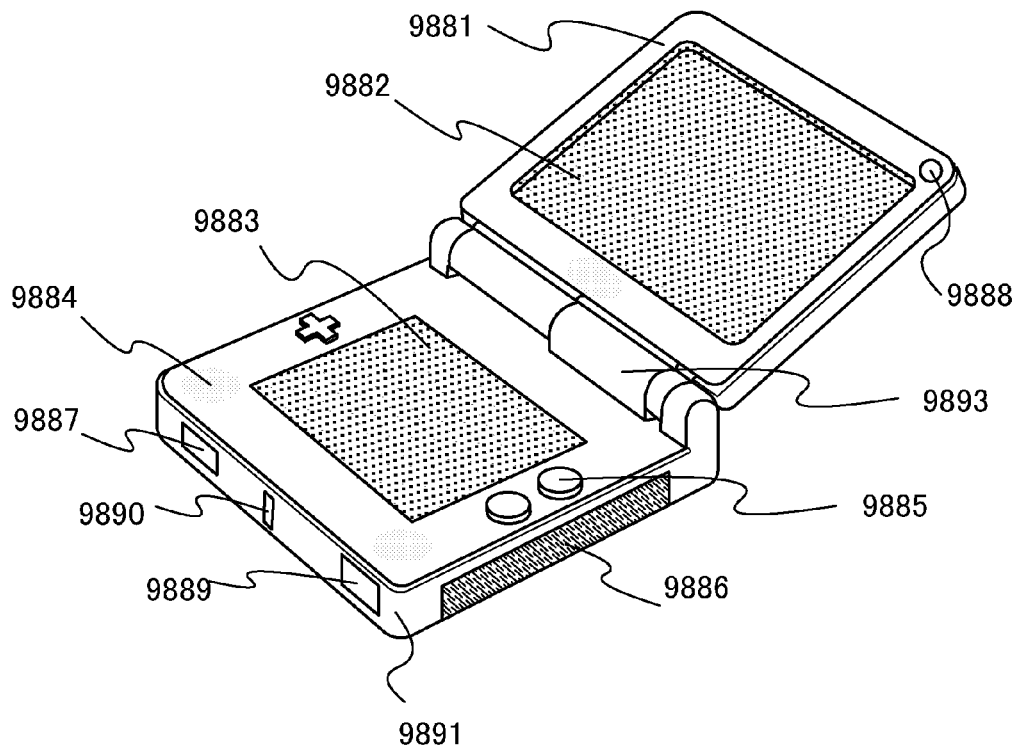
FIGS. 25A and 25B are external views each illustrating examples of game machines.

FIG. 25A illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The portable game console illustrated in FIG. 25A additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. Needless to say, the structure of the portable game console is not limited to the above, and may be any structure which is provided with at least a semiconductor device according to an embodiment of the present invention. Moreover, another accessory may be provided as appropriate. The portable game console illustrated in FIG. 25A has a function of reading a program or data stored in a storage medium to display it on the display portion, and a function of sharing information with another portable game console via wireless communication. The portable game console of FIG. 25A can have a variety of functions other than those above.

Figure 25B:
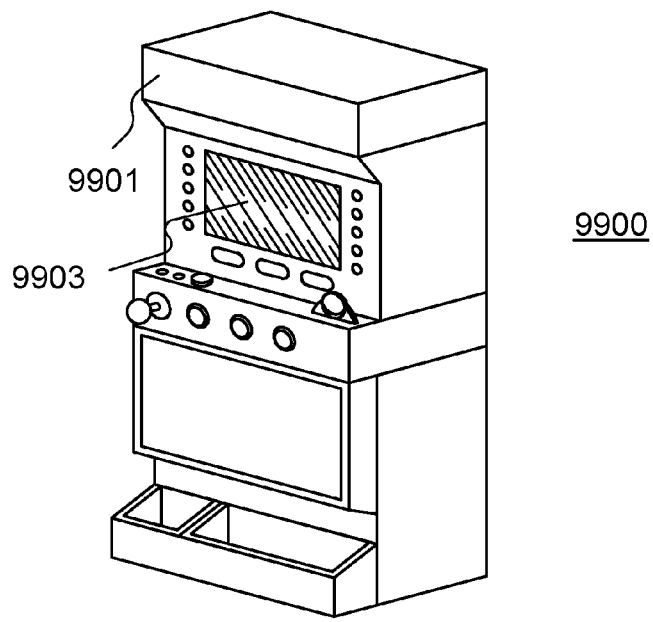

FIG. 25B illustrates an example of a slot machine 9900, which is a large game machine. A display portion 9903 is incorporated in a housing 9901 of the slot machine 9900. The slot machine 9900 additionally includes an operation means such as a start lever or a stop switch, a coin slot, a speaker, and the like. Needless to say, the structure of the slot machine 9900 is not limited to the above and may be any structure which is provided with at least a semiconductor device according to an embodiment of the present invention. Moreover, another accessory may be provided as appropriate.

Figure 26:
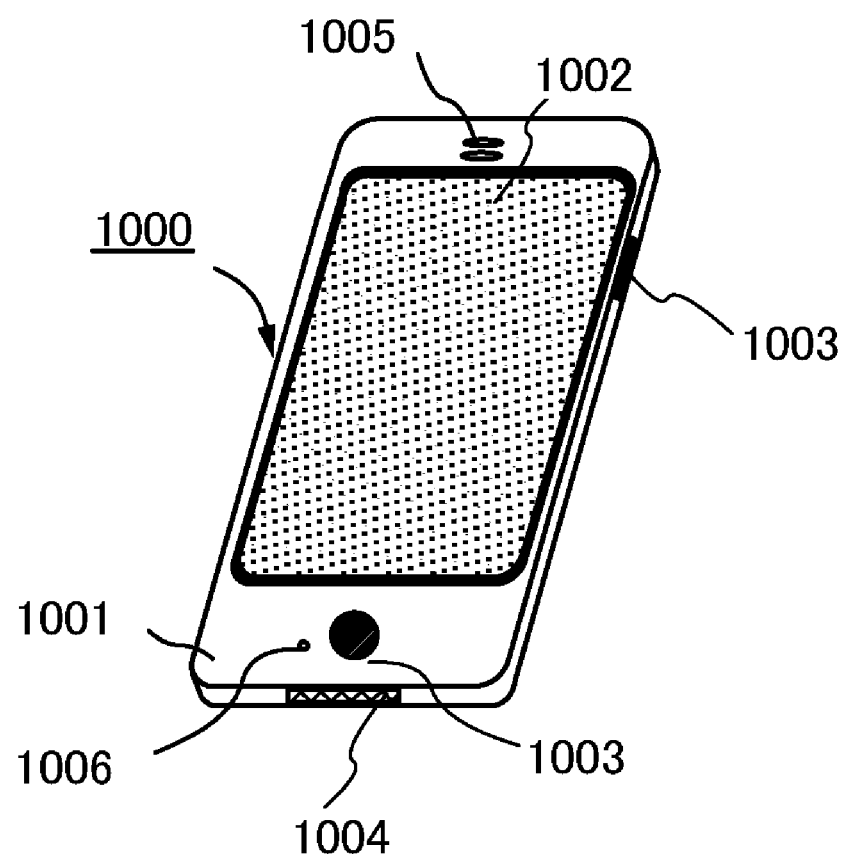
FIG. 26 is an external view illustrating an example of a cellular phone.

FIG. 26 illustrates an example of a cellular phone 1000. The cellular phone 1000 includes a housing 1001 in which a display portion 1002 is incorporated, and moreover includes an operation button 1003, an external connection port 1004, a speaker 1005, a microphone 1006, and the like.

Information can be input to the cellular phone 1000 illustrated in FIG. 26 by touching the display portion 1002 with a finger or the like. Moreover, calling or text messaging can be performed by touching the display portion 1002 with a finger or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are mixed.

For example, in the case of calling or text messaging, the display portion 1002 is set to a text input mode mainly for inputting text, and text input operation can be performed on a screen. In this case, it is preferable to display a keyboard or number buttons on almost the entire screen of the display portion 1002.

When a detection device including a sensor for detecting inclination, such as a gyroscope or an acceleration sensor, is provided inside the cellular phone 1000, display on the screen of the display portion 1002 can be automatically switched by judging the direction of the cellular phone 1000 (whether the cellular phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on kinds of images displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1002 and if input by touching the display portion 1002 is not performed for a certain period, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight or sensing light source which emits near-infrared light is provided in the display portion, an image of finger veins, palm veins, or the like can be taken.

In accordance with the above steps, an electronic appliance which has high reliability and is mounted with a protective circuit with stabilized operation and small occupied area can be manufactured.

This embodiment can be implemented in combination with the structure described in another embodiment, as appropriate.

This application is based on Japanese Patent Application serial no. 2008-259063 filed with Japan Patent Office on Oct. 3, 2008, the entire contents of which are hereby incorporated by reference.

What is claimed is:

1. A semiconductor device comprising:
   a line;
   a common wiring;
   a first non-linear element comprising:
      a first gate electrode layer;
      a gate insulating layer over the first gate electrode layer;
      a first wiring layer over the gate insulating layer;
      a second wiring layer over the gate insulating layer; and
      a first oxide semiconductor layer above and in contact with the gate insulating layer, the first wiring layer, and the second wiring layer; and
   a second non-linear element comprising a second gate electrode layer, a third wiring layer, a fourth wiring layer, and a second oxide semiconductor layer,
   wherein the common wiring is electrically connected to the first gate electrode layer, the first wiring layer, and the third wiring layer,
   wherein the line is electrically connected to the second gate electrode layer, the second wiring layer, and the fourth wiring layer, and
   wherein the line is in direct contact with the second wiring layer and the fourth wiring layer.

2. The semiconductor device according to claim 1, wherein each of the first oxide semiconductor layer and the second oxide semiconductor layer includes indium, gallium, and zinc.

3. The semiconductor device according to claim 1, wherein the gate insulating layer includes an aluminum oxide.

4. The semiconductor device according to claim 1, further comprising a pixel including a transistor, the transistor being electrically connected to the line,
   wherein the line is a scan line or a signal line.

5. The semiconductor device according to claim 1, wherein the first oxide semiconductor layer is formed by a non-single crystalline semiconductor film.

6. The semiconductor device according to claim 1, wherein each of the first oxide semiconductor layer and the second oxide semiconductor layer includes indium, and zinc.

7. A semiconductor device comprising:
   a line;
   a common wiring;
   a first non-linear element comprising:
      a first gate electrode layer;
      a gate insulating layer over the first gate electrode layer;
      a first wiring layer over the gate insulating layer;
      a second wiring layer over the gate insulating layer; and a first oxide semiconductor layer above and in contact with the gate insulating layer, the first wiring layer, and the second wiring layer;

a second non-linear element comprising a second gate electrode layer, a third wiring layer, a fourth wiring layer, and a second oxide semiconductor layer; and a third non-linear element comprising a third gate electrode layer, a fifth wiring layer, a sixth wiring layer, and a third oxide semiconductor layer, wherein the common wiring is electrically connected to the first gate electrode layer, the first wiring layer, and the fifth wiring layer, wherein the line is electrically connected to the second gate electrode layer, the third wiring layer, and the sixth wiring layer, wherein the third gate electrode layer is electrically connected to the second wiring layer and the fourth wiring layer, and wherein the line is in direct contact with the third wiring layer and the sixth wiring layer.

8. The semiconductor device according to claim 7, wherein each of the first oxide semiconductor layer and the second oxide semiconductor layer includes indium, gallium, and zinc.

9. The semiconductor device according to claim 7, wherein the gate insulating layer includes an aluminum oxide.

10. The semiconductor device according to claim 7, further comprising a pixel including a transistor, the transistor being electrically connected to the line, wherein the line is a scan line or a signal line.

11. The semiconductor device according to claim 7, wherein the first oxide semiconductor layer is formed by a non-single crystalline semiconductor film.

12. The semiconductor device according to claim 7, wherein each of the first oxide semiconductor layer and the second oxide semiconductor layer includes indium, and zinc.

13. A semiconductor device comprising:
a line;
a common wiring;
a first non-linear element comprising:
a first gate electrode layer;
a gate insulating layer over the first gate electrode layer;
a first wiring layer over the gate insulating layer;
a second wiring layer over the gate insulating layer; and
a first oxide semiconductor layer above and in contact with the gate insulating layer, the first wiring layer, and the second wiring layer; and
a second non-linear element comprising:
a second gate electrode layer;
the gate insulating layer over the second gate electrode layer;
a third wiring layer over the gate insulating layer;
a fourth wiring layer over the gate insulating layer; and
a second oxide semiconductor layer above and in contact with the gate insulating layer, the third wiring layer, and the fourth wiring layer,
wherein the first gate electrode layer is electrically connected to the common wiring,
wherein the first wiring layer and the third wiring layer are constituted by extending the common wiring,
wherein the second wiring layer and the fourth wiring layer are included in a layer,
wherein the layer is in direct contact with the line,
wherein the second gate electrode layer is constituted by extending the line,
wherein the first gate electrode layer and the second gate electrode layer are formed of the first same material, and wherein the common wiring and the layer are formed of the second same material.

14. The semiconductor device according to claim 13, wherein each of the first oxide semiconductor layer and the second oxide semiconductor layer includes indium, gallium, and zinc.

15. The semiconductor device according to claim 13, wherein the gate insulating layer includes an aluminum oxide.

16. The semiconductor device according to claim 13, further comprising a pixel including a transistor, the transistor being electrically connected to the line, wherein the line is a scan line or a signal line.

17. The semiconductor device according to claim 13, wherein the first oxide semiconductor layer is formed by a non-single crystalline semiconductor film.

18. The semiconductor device according to claim 13, wherein each of the first oxide semiconductor layer and the second oxide semiconductor layer includes indium, and zinc.

19. A semiconductor device comprising:
a line;
a common wiring;
a first non-linear element comprising:
a first gate electrode layer;
a gate insulating layer over the first gate electrode layer;
a first wiring layer over the gate insulating layer;
a second wiring layer over the gate insulating layer; and
a first oxide semiconductor layer above and in contact with the gate insulating layer, the first wiring layer, and the second wiring layer;
a second non-linear element comprising:
a second gate electrode layer;
the gate insulating layer over the second gate electrode layer;
a third wiring layer over the gate insulating layer;
a fourth wiring layer over the gate insulating layer; and
a second oxide semiconductor layer above and in contact with the gate insulating layer, the third wiring layer, and the fourth wiring layer; and
a third non-linear element comprising:
a third gate electrode layer;
the gate insulating layer over the second gate electrode layer;
a fifth wiring layer over the gate insulating layer;
a sixth wiring layer over the gate insulating layer; and
a third oxide semiconductor layer above and in contact with the gate insulating layer, the fifth wiring layer, and the sixth wiring layer,
wherein the first gate electrode layer is electrically connected to the common wiring,
wherein the first wiring layer and the fifth wiring layer are constituted by extending the common wiring,
wherein the second wiring layer and the fourth wiring layer are included in a first layer,
wherein the third wiring layer and the sixth wiring layer are included in a second layer,
wherein the first layer is electrically connected to the third gate electrode layer,
wherein the second gate electrode layer is constituted by extending the line, wherein the line is in direct contact with the second layer, wherein the first gate electrode layer, the second gate electrode layer, and the third gate electrode layer are formed of the first same material, and wherein the common wiring, the first layer, and the second layer are formed of the second same material.

20. The semiconductor device according to claim 19, wherein each of the first oxide semiconductor layer and the second oxide semiconductor layer includes indium, gallium, and zinc.

21. The semiconductor device according to claim 19, wherein the gate insulating layer includes an aluminum oxide.

22. The semiconductor device according to claim 19, further comprising a pixel including a transistor, the transistor being electrically connected to the line, wherein the line is a scan line or a signal line.

23. The semiconductor device according to claim 19, wherein the first oxide semiconductor layer is formed by a non-single crystalline semiconductor film.

24. The semiconductor device according to claim 19, wherein each of the first oxide semiconductor layer and the second oxide semiconductor layer includes indium, and zinc.

* * * * *